United States Patent
Ha et al.

(10) Patent No.: US 11,990,552 B2
(45) Date of Patent: May 21, 2024

(54) SEMICONDUCTOR DEVICES

(71) Applicant: Samsung Electronics Co., Ltd., Suwon-si (KR)

(72) Inventors: Ryong Ha, Seoul (KR); Seok Hoon Kim, Suwon-si (KR); Jung Taek Kim, Yongin-si (KR); Pan Kwi Park, Incheon (KR); Moon Seung Yang, Hwaseong-si (KR); Seo Jin Jeong, Incheon (KR)

(73) Assignee: Samsung Electronics Co., Ltd. (KR)

(*) Notice: Subject to any disclaimer, the term of this patent is extended or adjusted under 35 U.S.C. 154(b) by 110 days.

(21) Appl. No.: 17/533,719

(22) Filed: Nov. 23, 2021

(65) Prior Publication Data

US 2022/0181500 A1    Jun. 9, 2022

(30) Foreign Application Priority Data

Dec. 8, 2020 (KR) .................. 10-2020-0170073

(51) Int. Cl.
*H01L 29/786* (2006.01)
*H01L 29/66* (2006.01)
*H01L 29/423* (2006.01)

(52) U.S. Cl.
CPC .... *H01L 29/78618* (2013.01); *H01L 29/6653* (2013.01); *H01L 29/66742* (2013.01); *H01L 29/78696* (2013.01); *H01L 29/42392* (2013.01)

(58) Field of Classification Search
CPC .......... H01L 29/78618; H01L 29/6653; H01L 29/66742; H01L 29/78696; H01L 29/42392; H01L 29/66439; H01L 29/0653; H01L 29/41766; H01L 29/4238; H01L 29/6654; H01L 29/0847; H01L 29/775; H01L 29/7831; H01L 29/42356; H01L 21/823412; H01L 21/823425; H01L 21/823437; H01L 21/823462; H01L 21/823468; H01L 29/0673
See application file for complete search history.

(56) References Cited

U.S. PATENT DOCUMENTS

| | | | |
|---|---|---|---|
| 9,741,811 B2 | 8/2017 | Hatcher et al. | |
| 9,853,129 B2 | 12/2017 | Bauer et al. | |
| 10,355,102 B2 | 7/2019 | Cheng et al. | |
| 10,541,318 B2 | 1/2020 | Yamashita et al. | |
| 10,553,679 B2 | 2/2020 | Zhang et al. | |
| 2016/0172358 A1* | 6/2016 | Hatcher | H01L 29/775 257/401 |
| 2020/0013904 A1 | 1/2020 | Tsai et al. | |
| 2020/0020771 A1* | 1/2020 | Chen | H01L 29/7848 |
| 2020/0075716 A1 | 3/2020 | Wang et al. | |
| 2020/0091288 A1* | 3/2020 | Lee | H01L 29/6656 |
| 2021/0082914 A1 | 3/2021 | Lee et al. | |

* cited by examiner

*Primary Examiner* — Cuong B Nguyen
(74) *Attorney, Agent, or Firm* — Myers Bigel, P.A.

(57) ABSTRACT

A semiconductor device includes an active pattern which includes a lower pattern, and a sheet pattern that is spaced apart from the lower pattern in a first direction, a gate structure on the lower pattern that includes a gate electrode that surrounds the sheet pattern, the gate electrode extending in a second direction that is perpendicular to the first direction, and a source/drain pattern on the lower pattern and in contact with the sheet pattern. A contact surface between the sheet pattern and the source/drain pattern has a first width in the second direction, and the sheet pattern has a second width in the second direction that is greater than the first width.

17 Claims, 44 Drawing Sheets

SEMICONDUCTOR DEVICES

CROSS-REFERENCE TO RELATED APPLICATION

This application claims priority and all the benefits accruing therefrom under 35 U.S.C. § 119 from Korean Patent Application No. 10-2020-0170073 filed on Dec. 8, 2020, in the Korean Intellectual Property Office, the entire contents of which are herein incorporated by reference.

BACKGROUND

1. Field of the Disclosure

The present disclosure relates to semiconductor devices, and, more specifically, to semiconductor devices including an MBCFET™ (Multi-Bridge Channel Field Effect Transistor).

2. Description of the Related Art

As one of various scaling technologies for increasing the density of semiconductor devices, a multi gate transistor in which a multi-channel active pattern (or silicon body) having a fin or nanowire shape is formed on a substrate and a gate is formed on the multi-channel active have been proposed.

Since such a multi gate transistor utilizes three-dimensional channels, scaling may be readily performed. Further, even if a gate length of the multi gate transistor is not increased, current control capability can be improved. Furthermore, it is possible to effectively suppress a SCE (short channel effect) in which potential of a channel region is influenced by a drain voltage.

SUMMARY

Aspects of the present disclosure provide semiconductor devices having improved performance and reliability.

According to some aspects of the present disclosure, there is provided a semiconductor device including an active pattern which includes a lower pattern and a sheet pattern spaced apart from the lower pattern in a first direction, a gate structure on the lower pattern that includes a gate electrode that surrounds the sheet pattern, the gate electrode extending in a second direction that is perpendicular to the first direction, and a source/drain pattern on the lower pattern and in contact with the sheet pattern. A contact surface between the sheet pattern and the source/drain pattern has a first width in the second direction, and the sheet pattern has a second width in the second direction that is greater than the first width.

According to some aspects of the present disclosure, there is provided a semiconductor device comprising an active pattern including a lower pattern and a plurality of sheet patterns spaced apart from the lower pattern in a first direction, a gate structure including a gate insulating film that is on the lower pattern and surrounds respective ones of the plurality of sheet patterns, a gate electrode on the gate insulating film, and a gate spacer on a side wall of the gate electrode, the gate electrode extending in a second direction that is perpendicular to the first direction, and a source/drain pattern on the lower pattern and in contact with each of the plurality of sheet patterns and the gate insulating film. The gate spacer overlaps each of the plurality of sheet patterns in a third direction that is perpendicular to the first direction and the second direction, a contact surface between the respective ones of the plurality of sheet patterns and the source/drain pattern has a first width in the second direction, and the respective ones of the plurality of sheet patterns have a second width in the second direction that is greater than the first width.

According to some aspects of the present disclosure, there is provided a semiconductor device including an active pattern including a lower pattern and a plurality of sheet patterns spaced apart from the lower pattern in a first direction, a gate structure including a gate insulating film on the lower pattern and surrounding respective ones of the plurality of sheet patterns, a gate electrode on the gate insulating film, and a gate spacer on a side wall of the gate electrode, the gate electrode extending in a second direction that is perpendicular to the first direction, a source/drain pattern on the lower pattern and in contact with each of the sheet patterns and the gate insulating film, and an epi-spacer between the gate spacer and the source/drain pattern and extending in the first direction, wherein the epi-spacer protrudes from each of the sheet patterns in a third direction that is perpendicular to the first direction and the second direction, and the epi-spacer is in contact with each of the sheet patterns and the gate insulating film.

However, aspects of the present disclosure are not restricted to those set forth above. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

A semiconductor device according to some embodiments may include a tunneling transistor (tunneling FET), a three-dimensional (3D) transistor, or a two-dimensional material-based transistor (2D material-based FETs) and a heterostructure thereof. In addition, the semiconductor device according to some embodiments may also include a bipolar junction transistor, a laterally diffused metal oxide semiconductor (LDMOS), or the like.

The semiconductor device according to some embodiments of the present disclosure will be described referring to FIGS. 1 to 7.

Figure 1:
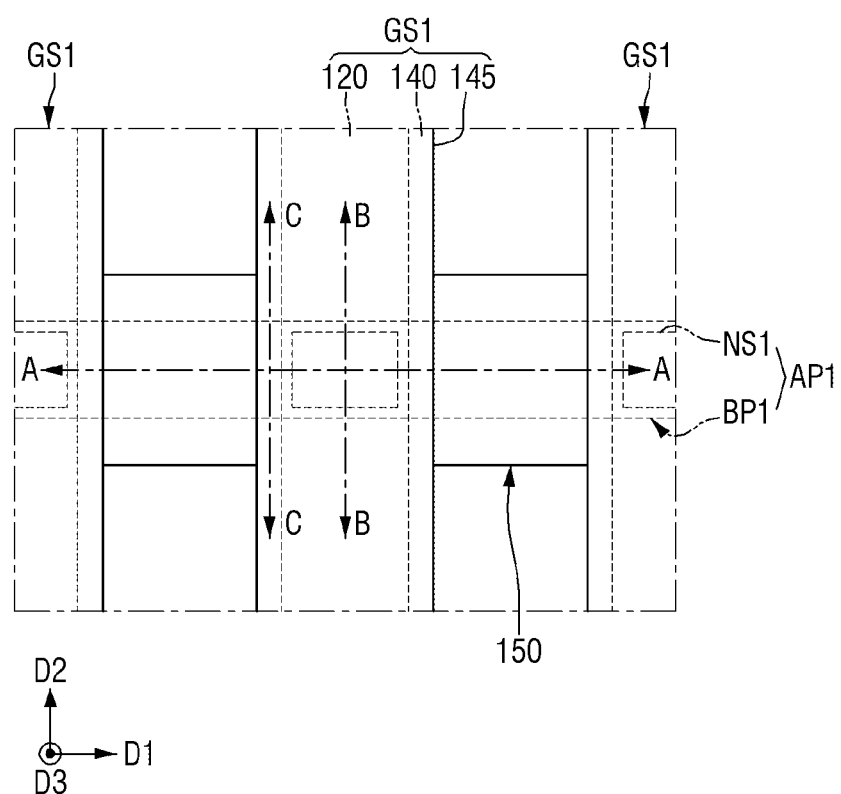
FIG. 1 is an example plan view of a semiconductor device according to some embodiments of the present disclosure.
Figure 2:
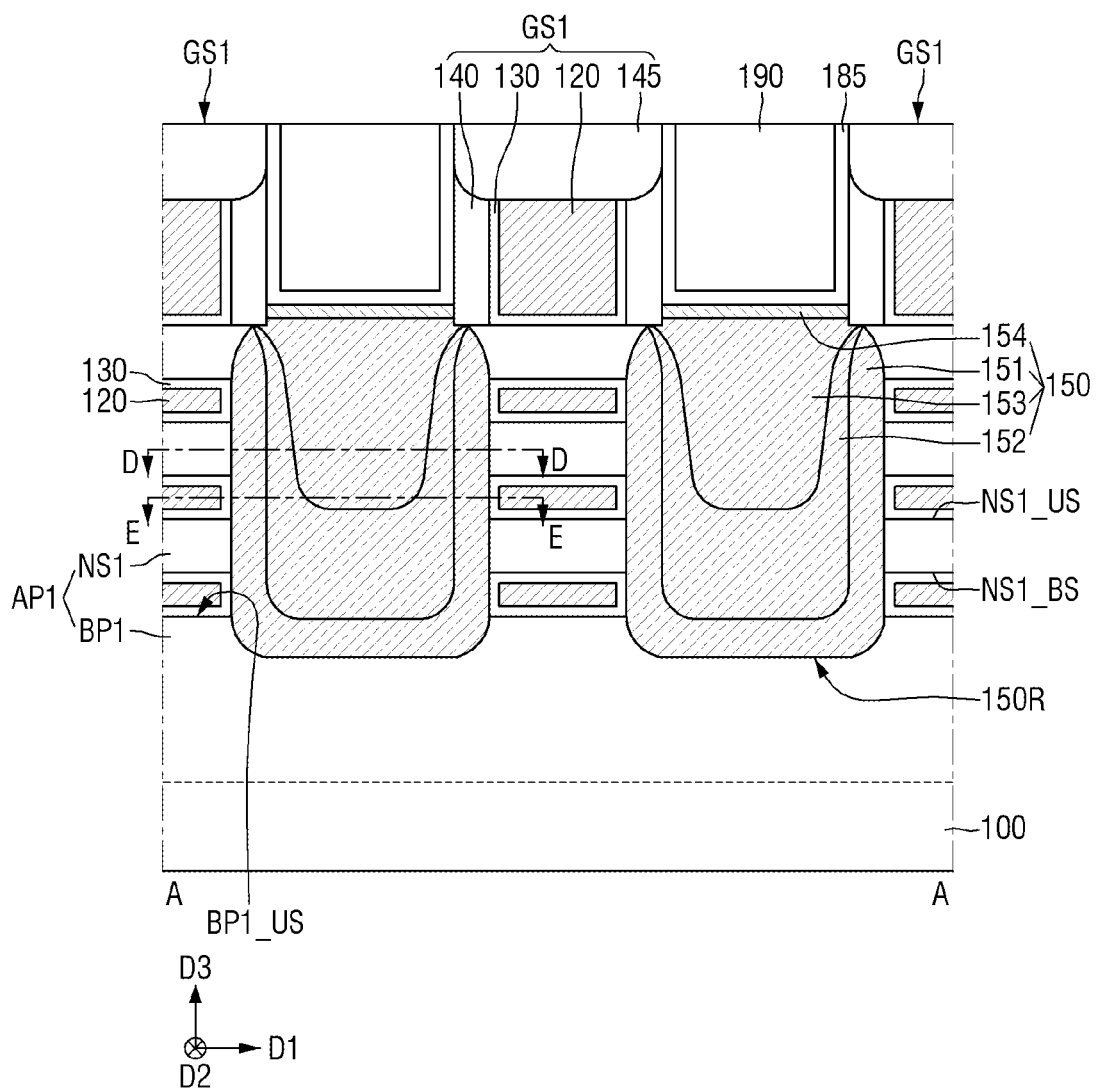
FIG. 2 is a cross-sectional view taken along A-A of FIG. 1.
Figure 3:
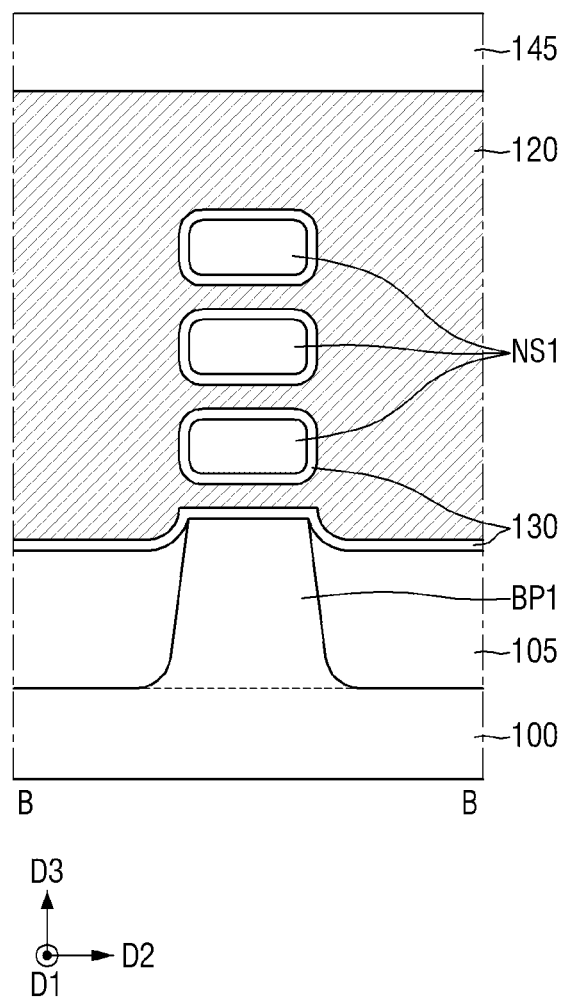
FIG. 3 is a cross-sectional view taken along B-B of FIG. 1.
Figure 4:
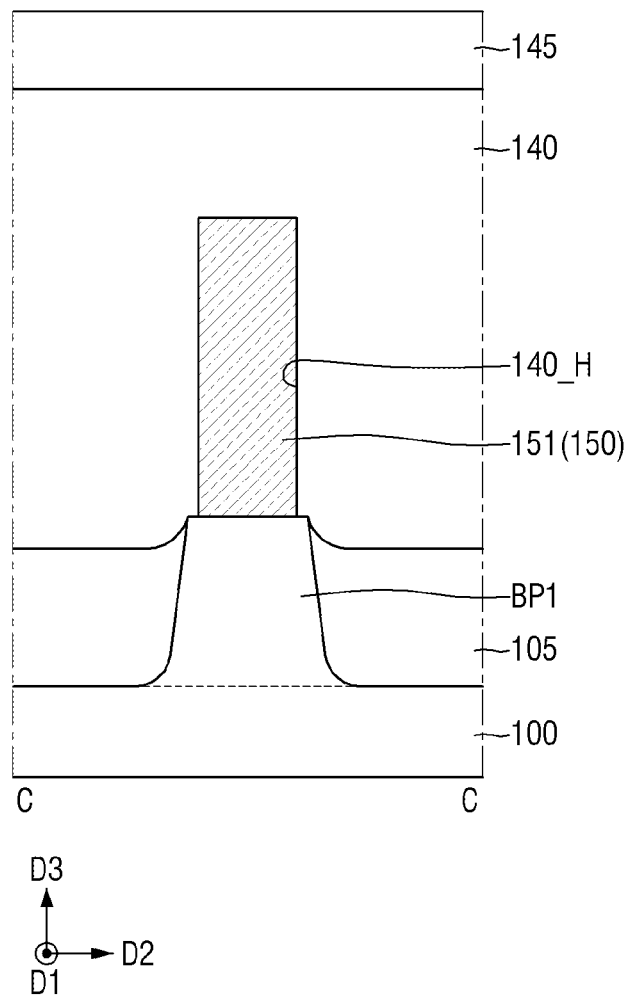
FIG. 4 is a cross-sectional view taken along C-C of FIG. 1.
Figure 5:
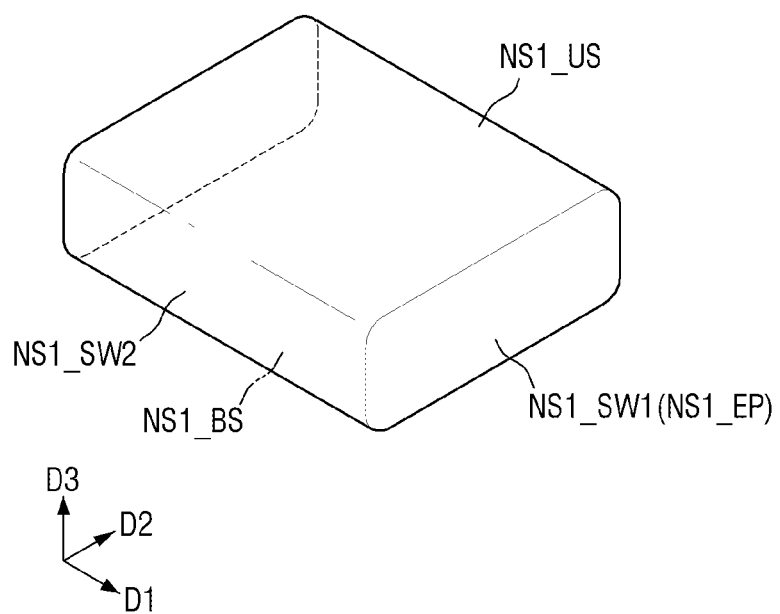
FIG. 5 is a diagram for explaining a shape of a first sheet pattern of FIG. 2.
Figure 6:
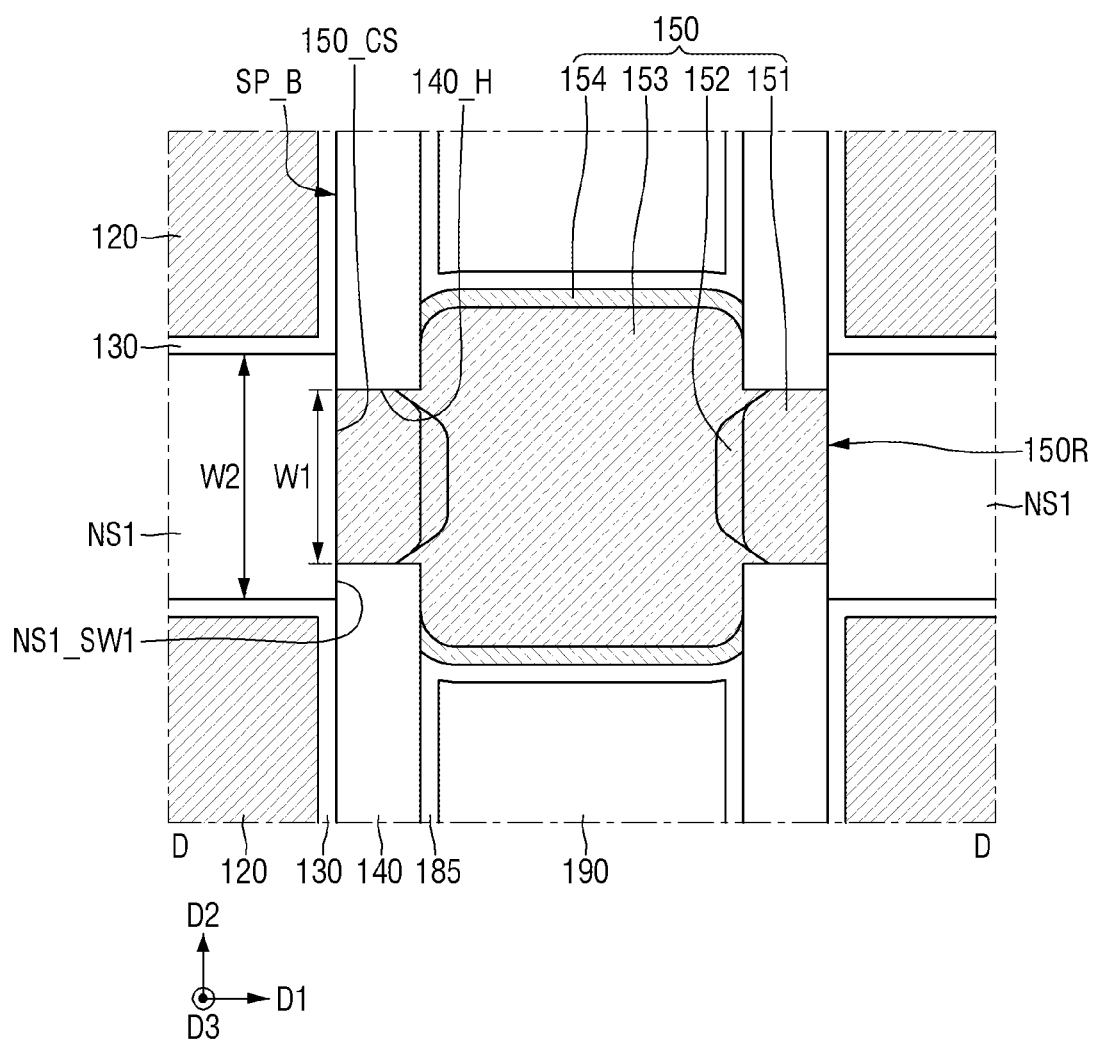
FIG. 6 is a cross-sectional view taken along D-D of FIG. 2.
Figure 7:
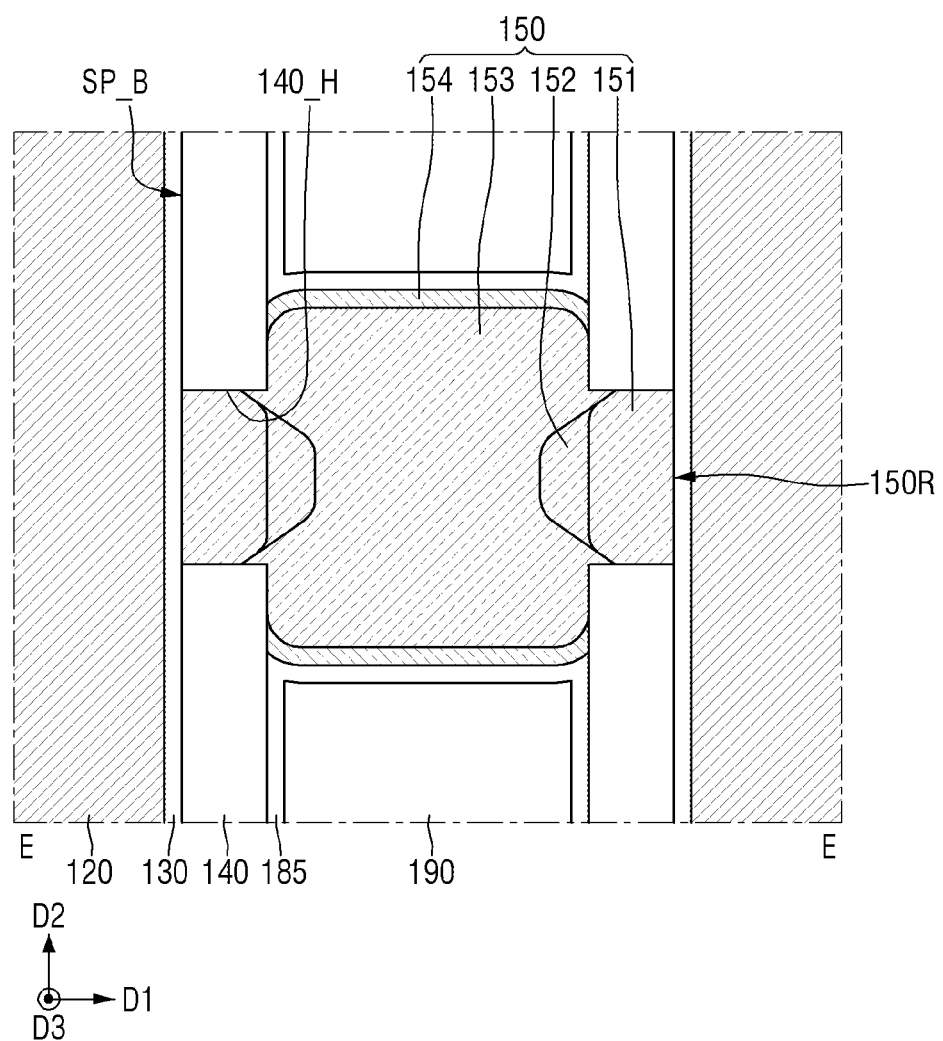
FIG. 7 is a cross-sectional view taken along E-E of FIG. 2.

FIG. 1 is an example plan view of a semiconductor device according to some embodiments of the present disclosure. FIG. 2 is a cross-sectional view taken along A-A of FIG. 1. FIG. 3 is a cross-sectional view taken along B-B of FIG. 1. FIG. 4 is a cross-sectional view taken along C-C of FIG. 1. FIG. 5 is a diagram for explaining a shape of a first sheet pattern of FIG. 2. FIG. 6 is a cross-sectional view taken along D-D of FIG. 2. FIG. 7 is a cross-sectional view taken along E-E of FIG. 2.

For reference, FIGS. 6 and 7 are diagrams showing a D1-D2 plane. In addition, FIG. 1 briefly shows a reduced configuration, omitting a first gate insulating film 130, an etching stop film 185, and an interlayer insulating film 190 for ease of description.

Referring to FIGS. 1 to 7, the semiconductor device according to some embodiments may include a first active pattern AP1, a plurality of first gate structures GS1, and a first source/drain pattern 150.

A substrate 100 may be bulk silicon or an SOI (silicon-on-insulator). In some embodiments, the substrate 100 may be a silicon substrate, or may include other materials, but are not limited to, for example, silicon germanium, SGOI (silicon germanium on insulator), indium antimonide, lead tellurium compounds, indium arsenic, indium phosphide, gallium arsenide or gallium antimonide.

A first active pattern AP1 may be placed on the substrate 100. Each of the first active patterns AP1 may extend long in a first direction D1 (e.g., have a longitudinal axis extending in the first direction D1). For example, the first active pattern AP1 may be placed in a region in which a PMOS device is formed. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend long in the first direction D1.

A plurality of first sheet patterns NS1 may be placed on an upper surface BP1_US of the first lower pattern BP1. The plurality of first sheet patterns NS1 may be spaced apart from the first lower pattern BP1 in a third direction D3. Each of the first sheet patterns NS1 may be spaced apart from each other in the third direction D3.

Each first sheet pattern NS1 may include an upper surface NS1_US and a lower surface NS1_BS. The upper surface NS1_US of the first sheet pattern is a surface that is opposite to the lower surface NS1_BS of the first sheet pattern in the third direction D3. Each first sheet pattern NS1 may include first side walls NS1_SW1 opposite to each other the first direction D1, and second side walls NS1_SW2 opposite to each other in the second direction D2.

The upper surface NS1_US of the first sheet pattern and the lower surface NS1_BS of the first sheet pattern may be connected by the first side walls NS1_SW1 of the first sheet pattern and the second side walls NS1_SW2 of the first sheet pattern. The first side walls NS1_SW1 of the first sheet pattern are connected to and in contact with a first source/drain pattern 150 to be described below. The first side walls NS1_SW1 of the first sheet pattern may be a termination NS1_EP of the first sheet pattern (e.g., an end of the first sheet pattern).

In FIGS. 5 and 6, the first side walls NS1_SW1 of the first sheet pattern are shown as a plane, but are not limited thereto. That is, the first side walls NS1_SW1 of the first sheet pattern may include a curved face portion.

Further, in FIGS. 3 and 5, the second side walls NS1_SW2 of the first sheet pattern are shown as a combination of a curved face portion and a plane portion, but are not limited thereto. That is, the second side wall NS1_SW2 of the first sheet pattern may be generally a curved face or a plane.

The third direction D3 may be a direction that intersects the first direction D1 and the second direction D2. For example, the third direction D3 may be a thickness direction of the substrate 100. The first direction D1 may be a direction that intersects the second direction D2.

Although three first sheet patterns NS1 are shown as being placed in the third direction D3, this is only for convenience of explanation, and the embodiments of the present disclosure are not limited thereto.

The first lower pattern BP1 may be formed by etching a part of the substrate 100, and may include an epitaxial layer that is grown from the substrate 100. The first lower pattern BP1 may include silicon or germanium, which is an elemental semiconductor material. In some embodiments, the first lower pattern BP1 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, one of a binary compound, a ternary compound, or a quaternary compound formed by combining at least one of aluminum (Al), gallium (Ga) and indium (In) as a group III element with one of phosphorus (P), arsenic (As) and antimony (Sb) as a group V element.

The first sheet pattern NS1 may include one of silicon or germanium, which is an elemental semiconductor material, a group IV-IV compound semiconductor, or a group III-V compound semiconductor. Each first sheet pattern NS1 may include the same material as the first lower pattern BP1, or may include a material different from the first lower pattern BP1.

In the semiconductor device according to some embodiments, the first lower pattern BP1 may be a silicon lower pattern including silicon, and the first sheet pattern NS1 may be a silicon sheet pattern including silicon.

A width of the first sheet pattern NS1 in the second direction D2 may be increased or decreased in proportion to a width of the first lower pattern BP1 in the second direction D2. As an example, although the width in the second direction D2 of the first sheet patterns NS1 stacked in the third direction D3 is shown as being the same, this is only for convenience of explanation, and the embodiments of the present disclosure are not limited thereto. Unlike the shown configuration, as a distance from the first lower pattern BP1 increases, the width in the second direction D2 of the first sheet patterns NS1 stacked in the third direction D3 may decrease.

A field insulating film 105 may be formed on the substrate 100. The field insulating film 105 may be placed on the side walls of the first lower pattern BP1. The field insulating film 105 is not placed on the upper surface BP1_US of the first lower pattern.

As an example, the field insulating film 105 may be on, and in some embodiments, entirely cover the side walls of the first lower pattern BP1. Unlike the shown configuration, the field insulating film 105 may cover a part of the side walls of the first lower pattern BP1. In such a case, a part of the first lower pattern BP1 may protrude in the third direction D3 beyond the upper surface of the field insulating film 105.

Each first sheet pattern NS1 is placed to be higher than the upper surface of the field insulating film 105. The field insulating film 105 may include, for example, an oxide film, a nitride film, an oxynitride film or a combination film thereof. Although the field insulating film 105 is shown as a single film, this is only for convenience of explanation, and the embodiments of the present disclosure are not limited thereto.

A plurality of first gate structures GS1 may be placed on the substrate 100. Each first gate structure GS1 may extend in the second direction D2. Adjacent first gate structures GS1 may be spaced apart from each other in the first direction D1.

The first gate structure GS1 may be placed on the first active pattern AP1. The first gate structure GS1 may intersect the first active pattern AP1.

The first gate structure GS1 may be on and/or intersect the first lower pattern BP1. The first gate structure GS1 may surround each first sheet pattern NS1. It will be understood that "an element A surrounds an element B" (or similar language) as used herein means that the element A is at least partially around the element B but does not necessarily mean that the element A completely encloses the element B.

The first gate structure GS1 may include, for example, a first gate electrode 120, a first gate insulating film 130, a first gate spacer 140, and a first gate capping pattern 145.

The first gate electrode 120 may be formed on the first lower pattern BP1. The first gate electrode 120 may intersect the first lower pattern BP1. The first gate electrode 120 may surround the first sheet pattern NS1.

A part of the first gate electrode 120 may be placed between the first sheet patterns NS1 adjacent to each other in the third direction D3. When the first sheet pattern NS1 includes a first_1 sheet pattern and a first_2 sheet pattern adjacent to each other, a part of the first gate electrode 120 may be placed between the upper surface NS1_US of the first_1 sheet pattern and the lower surface NS1_BS of the first_2 sheet pattern facing each other.

The first gate electrode 120 may include at least one of a metal, a metal alloy, a conductive metal nitride, a metal silicide, a doped semiconductor material, a conductive metal oxide, and/or a conductive metal oxynitride. The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Conductive metal oxides and conductive metal oxynitrides may include, but are not limited to, the oxidized forms of the aforementioned materials.

The first gate electrode 120 may be placed on both sides of a first source/drain pattern 150 to be described below. The first gate structure GS1 may be placed on both sides of the first source/drain pattern 150 in the first direction D1.

As an example, both the first gate electrodes 120 placed on either side of the first source/drain pattern 150 may be a gate electrode used for a gate of the transistor (e.g., a normal gate electrode). As another example, although the first gate electrode 120 placed on one side of the first source/drain pattern 150 is used as the gate of the transistor, the first gate electrode 120 placed on the other side of the first source/drain pattern 150 may be a dummy gate electrode.

The first gate insulating film 130 may extend along the upper surface of the field insulating film 105 and the upper surface BP1 of the first lower pattern. The first gate insulating film 130 may surround the first sheet pattern NS1. The first gate insulating film 130 may be placed along the periphery of the first sheet pattern NS1. The first gate electrode 120 is placed on the first gate insulating film 130. The first gate insulating film 130 is placed between the first gate electrode 120 and the first sheet pattern NS1.

A part of the first gate insulating film 130 may be placed between the first sheet patterns NS1 adjacent to each other in the third direction D3. When the first sheet pattern NS1 includes a first_1 sheet pattern and a first_2 sheet pattern adjacent to each other, a part of the first gate insulating film 130 may extend along the upper surface NS1_US of the first_1 sheet pattern and the lower surface NS1_BS of the first_2 sheet pattern facing each other.

The first gate insulating film 130 may include silicon oxide, silicon oxynitride, silicon nitride, and/or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

Although the first gate insulating film 130 is shown as a single film, this is only for convenience of explanation, and the embodiments of the present disclosure are not limited thereto. The first gate insulating film 130 may include a plurality of films. The first gate insulating film 130 may include an interfacial layer placed between the first sheet pattern NS1 and the first gate electrode 120, and a high dielectric constant insulating film.

The semiconductor device according to some embodiments may include an NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film may have the ferroelectric properties, but the paraelectric material film may not have the ferroelectric properties. For example, when the ferroelectric material film and the paraelectric material film include hafnium oxide, a crystal structure of hafnium oxide included in the ferroelectric material film may be different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which the plurality of ferroelectric material films and the plurality of paraelectric material films are alternately stacked.

The first gate spacer 140 may be placed on the side wall of the first gate electrode 120. The first gate spacer 140 may not be placed between the first lower pattern BP1 and the first nanosheet NS1, and between the first nanosheets NS1 adjacent to each other in the third direction D3.

The first gate spacer 140 may include a spacer hole 140_H extending in the third direction D3. Side walls of the spacer hole 140_H extending in the first direction D1 may be defined by the first gate spacer 140 and the first lower pattern BP1. The first sheet pattern NS1 may be connected to (e.g., in contact with) the first source/drain pattern 150 through the spacer hole 140_H. In the semiconductor device according to some embodiments, the width of the spacer hole 140_H in the second direction D2 is smaller than the width of the upper surface BP1_US of the first lower pattern in the second direction D2. In some embodiments, a part of the first gate spacer 140 may span the upper surface BP1_US of the first lower pattern.

In FIGS. 6 and 7, the first gate structure GS1 may include a spacer boundary SP_B defined between the first gate insulating film 130 and the first gate spacer 140. The spacer boundary SP_B extends in the second direction D2. When the first gate spacer 140 includes an inner wall facing the first gate electrode 120, and an outer wall facing the interlayer insulating film 190, the spacer boundary SP_B may be an inner wall of the first gate spacer 140.

The first gate spacer 140 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. Although the first gate spacer 140 is shown as a single film, this is only for convenience of explanation, and the embodiment is not limited thereto.

The first gate capping pattern 145 may be placed on the first gate electrode 120 and the first gate spacer 140. An upper surface of the first gate capping pattern 145 may be placed on the same plane as an upper surface of the interlayer insulating film 190. Unlike the shown configuration, the first gate capping pattern 145 may be placed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity to the interlayer insulating film 190.

The first source/drain pattern 150 may be formed on the first active pattern AP1. The first source/drain pattern 150 may be formed on the first lower pattern BP1. The first source/drain pattern 150 may be in contact with the first sheet pattern NS1.

The first source/drain pattern 150 may be placed on the side surfaces of the first gate structure GS1. The first source/drain pattern 150 may be placed between the first gate structures GS1 adjacent to each other in the first direction D1. For example, the first source/drain pattern 150 may be placed on both sides of the first gate structure GS1. Unlike the shown configuration, the first source/drain pattern 150 is placed on one side of the first gate structure GS1, and may not be placed on the other side of the first gate structure GS1.

The first source/drain pattern 150 may be included in a source/drain of a transistor that uses the first sheet pattern NS1 as a channel region.

The first source/drain pattern 150 may be placed inside the first source/drain recess 150R. The first source/drain recess 150R may extend in the third direction D3. A bottom surface of the first source/drain recess 150R may be defined by the first lower pattern BP1. Side walls of the first source/drain recess 150R may be defined by the first sheet pattern NS1 and the first gate structure GS1. The first gate insulating film 130 and the first gate spacer 140 in the first gate structure GS1 may define a part of the first source/drain recess 150R. In FIGS. 6 and 7, the first source/drain recess 150R includes the side walls of the spacer hole 140_H.

Although the upper part of the side walls of the first source/drain recess 150R is shown to decrease in width in the first direction D1 as it goes away from the first lower pattern BP1, the embodiments of the present disclosure are not limited thereto.

A part of the first source/drain pattern 150 may pass through the spacer hole 140_H. The first source/drain pattern 150 may fill at least part of the spacer hole 140_H. The first source/drain pattern 150 may be in contact with the first sheet pattern NS1 through the spacer hole 140_H.

The first gate spacer 140 may not be placed between the first gate electrode 120 between the adjacent first nanosheets NS1 and the first source/drain pattern 150. The first gate insulating film 130 may be in contact with the first source/drain pattern 150.

Between the first nanosheet NS1 placed at the lowermost part and the first lower pattern BP1, a boundary between the first gate insulating film 130 and the first lower pattern BP1 may be an upper surface BP1_US of the first lower pattern. In some embodiments, in FIG. 2, the first gate structure GS1 may include a lowermost sub-gate structure placed between the first bottom pattern BP1 and the first nanosheet NS1 placed at the lowermost part. The lowermost sub-gate structure may include a part of the first gate electrode 120 and a part of the first gate insulating film 130. The upper surface BP1_US of the first lower pattern may be a boundary between the lowermost sub-gate structure and the first lower pattern BP1. The bottom surface of the first source/drain recess 150R may be lower than the upper surface BP1_US of the first lower pattern.

The first source/drain pattern 150 may include a lower semiconductor pattern 151, an upper semiconductor pattern 152, a filling semiconductor pattern 153, and a capping semiconductor pattern 154.

The lower semiconductor pattern 151 may extend along a profile of the first source/drain recess 150R. The lower semiconductor pattern 151 may be in contact with the first gate insulating film 130, the first sheet pattern NS1, and the first lower pattern BP1.

The lower semiconductor pattern 151 may fill at least a part of the spacer hole 140_H. The lower semiconductor pattern 151 covers at least a part of the side wall of the spacer hole 140_H. The lower semiconductor pattern 151 forms a boundary with the side wall of the spacer hole 140_H.

The upper semiconductor pattern 152 may be placed on the lower semiconductor pattern 151. The upper semiconductor pattern 152 may be in contact with the lower semiconductor pattern 151. The filling semiconductor pattern 153 may be placed on the upper semiconductor pattern 152. The filling semiconductor pattern 153 may be in contact with the upper semiconductor pattern 152. The capping semiconductor pattern 154 may be placed on the filling semiconductor pattern 153. The upper semiconductor pattern 152, the filling semiconductor pattern 153, and the capping semiconductor pattern 154 may not be in contact with the first gate insulating film 130.

The lower semiconductor pattern 151, the upper semiconductor pattern 152, and the filling semiconductor pattern 153 may each include silicon-germanium. In some embodiments, the lower semiconductor pattern 151, the upper semiconductor pattern 152, and the filling semiconductor pattern 153 may each include a silicon-germanium film. The capping semiconductor pattern 154 may include, for example, silicon. The capping semiconductor pattern 154 may include a silicon film.

The lower semiconductor pattern 151, the upper semiconductor pattern 152, and the filling semiconductor pattern 153 may each include a doped p-type impurity. The p-type impurity may be, but is not limited to, for example, boron (B). The capping semiconductor pattern 154 may include, but is not limited to, doped p-type impurity.

For example, a germanium fraction of the upper semiconductor pattern 152 may be greater than a germanium fraction of the lower semiconductor pattern 151, and may be smaller than a germanium fraction of the filling semiconductor pattern. The first source/drain pattern 150 may include a plurality of silicon-germanium films, in which the germanium fraction increases as it goes away from the first lower pattern BP1, on the first lower pattern BP1.

The first source/drain pattern 150 is shown to include, but is not limited to, a silicon-germanium films of three layers sequentially formed on the first lower pattern BP1. Unlike the shown configuration, the first source/drain pattern 150 may include silicon-germanium films of two layers or silicon-germanium films of four layers or more. Also, unlike the shown configuration, the first source/drain pattern 150 may not include the capping semiconductor pattern 154.

Unlike the shown configuration, the first source/drain pattern 150 may further include an insertion semiconductor pattern having a lower germanium fraction than the lower semiconductor pattern 151, between the lower semiconductor pattern 151 and the upper semiconductor pattern 152. In some embodiments, the first source/drain pattern 150 may further include an insertion semiconductor pattern having a lower germanium fraction than the upper semiconductor pattern 152, between the upper semiconductor pattern 152 and the filling semiconductor pattern 153.

The first source/drain pattern 150 includes a contact surface 150_CS which is in contact with the first sheet pattern NS1. The contact surface 150_CS of the first source/drain pattern has a first width W1 in the second direction D2. The first sheet pattern NS1 has a second width W2 in the second direction D2. In the semiconductor device according to some embodiments, the first width W1 is smaller than the second width W2. Here, the second width W2 may be a width in a portion in which the first sheet pattern NS1 overlaps the first gate electrode 120 in the second direction D2.

In the semiconductor device according to some embodiments, the first gate spacer 140 overlaps the first sheet pattern NS1 in the first direction D1. That is, a part of the first sheet pattern NS1 overlaps the first gate spacer 140 in the first direction D1. The first gate spacer 140 covers a part of the first side wall NS1_SW1 of the first sheet pattern. For example, the width of the spacer hole 140_H in the second direction D2 is smaller than the second width W2 of the first sheet pattern NS1 in the second direction D2.

Since the width W1 of the contact surface 150_CS of the first source/drain pattern in the second direction D2 is smaller than the width W2 of the first sheet pattern NS1 in the second direction D2, while the lower semiconductor pattern 151 is growing, the facet development of the lower semiconductor pattern 151 may be delayed. During the fabricating process, the facet of the lower semiconductor pattern 151 may easily develop in an edge portion (for example, the second side wall NS1_SW2 of the first sheet pattern of FIG. 5) of the first sheet pattern NS1 in the second direction D2. However, the edge portion of the first sheet pattern NS1 in which the facet easily develops is covered with the first gate spacer 140. As a result, before the facet of the lower semiconductor pattern 151 develops, the thickness of the lower semiconductor pattern 151 which forms the boundary with the side wall of the spacer hole 140_H increases. Because the thickness of the lower semiconductor pattern 151 which forms the boundary with the side wall of the first spacer hole 140_H has increased, etching of the upper semiconductor pattern 152 and/or the filling semiconductor pattern 153 is prevented in an etching process of etching a sacrificial pattern (SC_L of FIG. 38) for forming the first gate electrode 120.

In the semiconductor device according to some embodiments, the first sheet pattern NS1 does not include a portion protruding from the spacer boundary SP_B in the first direction D1. That is, the termination NS1_EP of the first sheet pattern may be located at the spacer boundary SP_B. In some embodiments, at least a portion of the first sheet pattern NS1 may be coplanar with the spacer boundary SP_B.

The etching stop film 185 may be placed on the side wall of the first gate structure GS1, the upper surface of the first source/drain pattern 150, and the side wall of the first source/drain pattern 150. Although not shown, the etching stop film 185 may be placed on the upper surface of the field insulating film 105. The etching stop film 185 may include a material having an etching selectivity with respect to an interlayer insulating film 190 to be described later. The etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be placed on the etching stop film 185. The interlayer insulating film 190 may be placed on the first source/drain pattern 150. The interlayer insulating film 190 may not cover the upper surface of the first gate capping pattern 145. For example, the upper surface of the interlayer insulating film 190 may be placed on the same plane as the upper surface of the first gate capping pattern 145.

The interlayer insulating film 190 may include, for example, at least one of silicon oxide, silicon nitride, silicon oxynitride, and/or a low dielectric constant material. The low dielectric constant material may include for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

Figure 8:
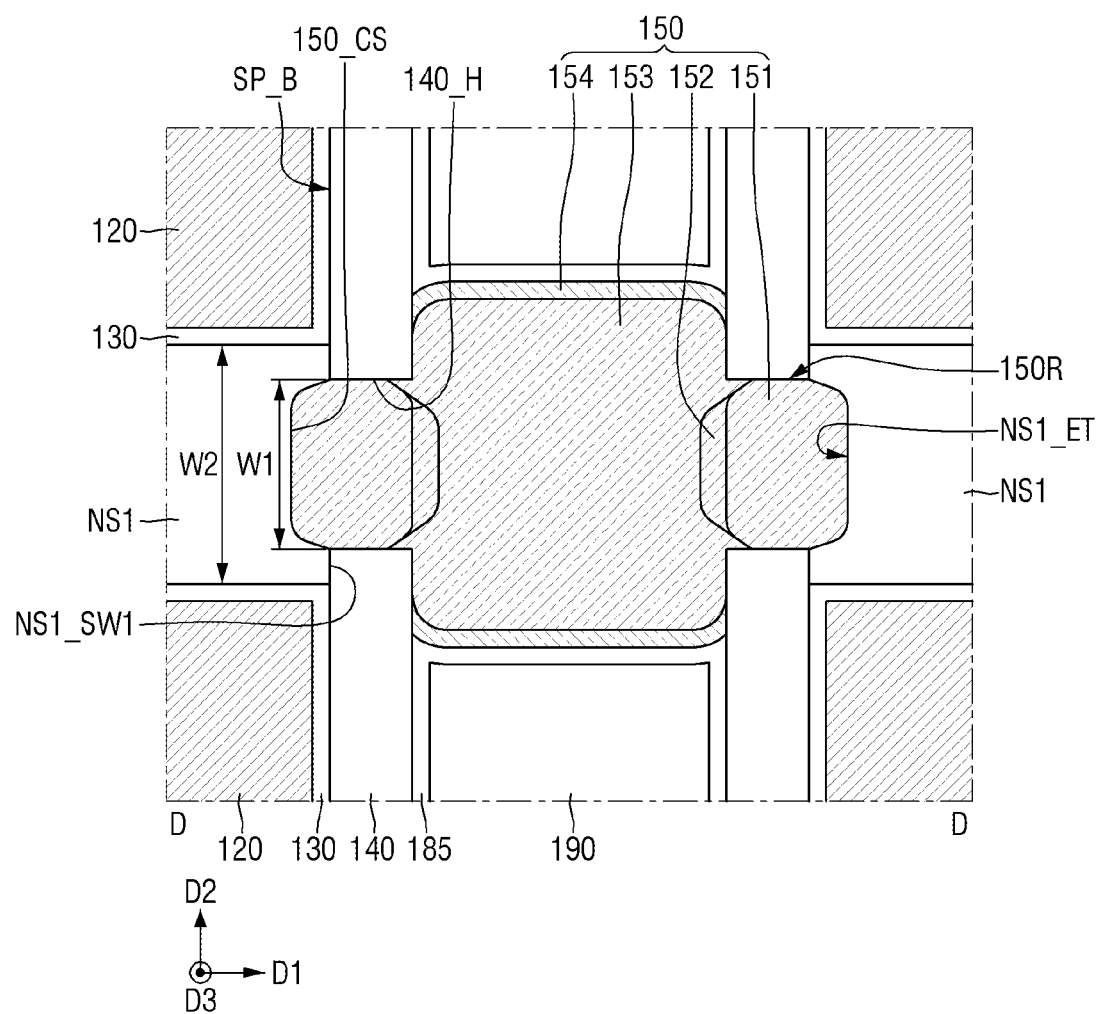
FIGS. 8 and 9 are diagrams of a semiconductor device according to some embodiments of the present disclosure.
Figure 9:
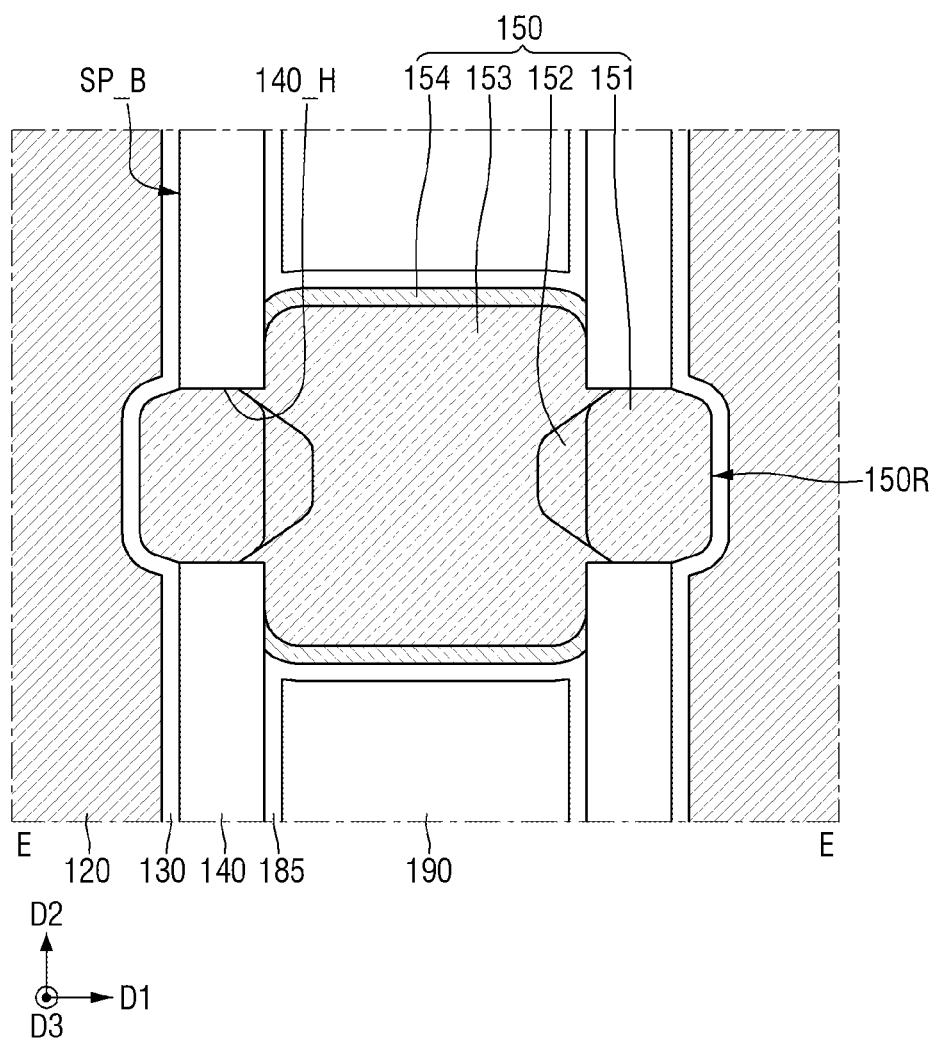

FIGS. 8 and 9 are diagrams for explaining a semiconductor device according to some embodiments. For convenience of explanation, the points different from those described using FIGS. 1 to 7 will be mainly described.

Referring to FIGS. 8 and 9, in the semiconductor device according to some embodiments, each of the first sheet patterns NS1 may further include an epi-trench NS1_ET placed at the termination NS1_EP of the first sheet pattern.

The epi-trench NS1_ET may be formed on the first side wall NS1_SW1 of the first sheet pattern. The epi-trench NS1_ET may penetrate in the first direction D1 from the first side wall NS1_SW1 of the first sheet pattern.

A part of the first source/drain pattern 150 may be in and/or fill the epi-trench NS1_ET. For example, the lower semiconductor pattern 151 may be in and/or fill the epi-trench NS1_ET.

The first source/drain pattern 150 that fills the epi-trench NS1_ET may protrude toward the first sheet pattern NS1 at the spacer boundary SP_B.

In FIG. 9, in the portion in which the first source/drain pattern 150 protrudes, the first gate insulating film 130 may protrude toward the first gate electrode 120 along the profile of the first source/drain pattern 150.

Figure 10:
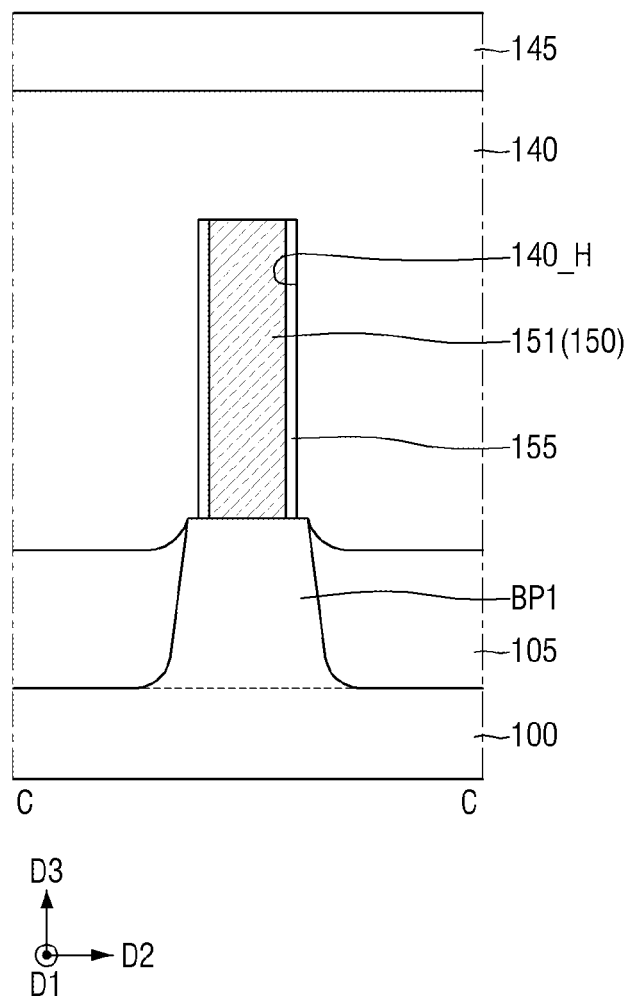
FIGS. 10 to 12 are diagrams of the semiconductor device according to some embodiments of the present disclosure.
Figure 11:
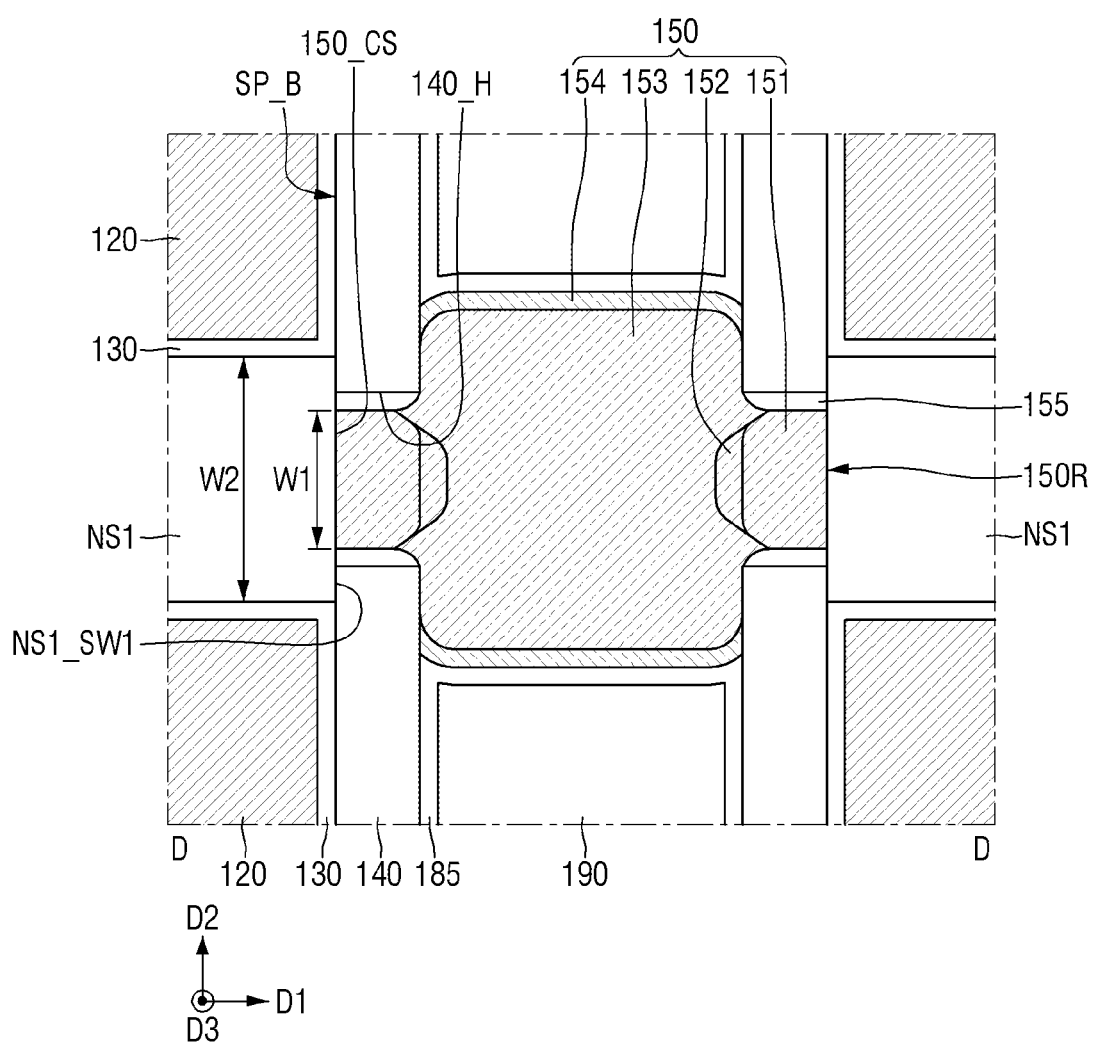
Figure 12:
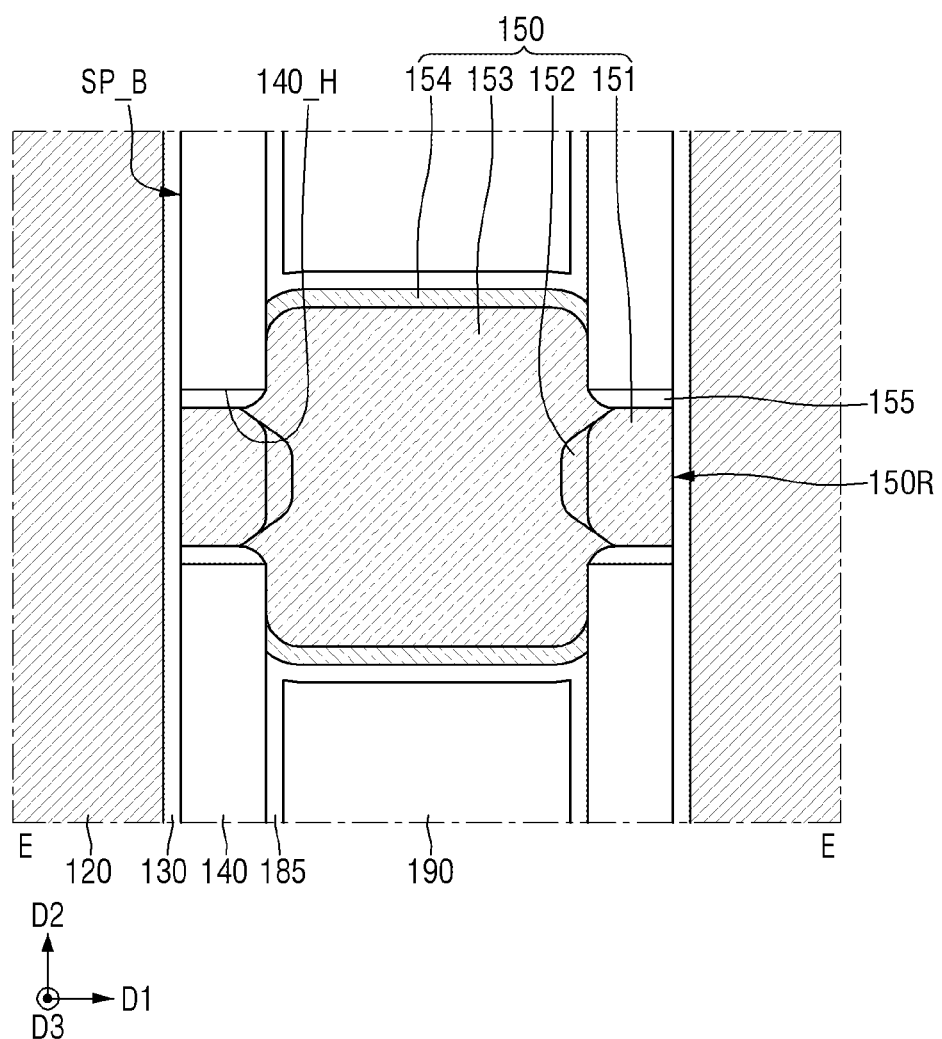

FIGS. 10 to 12 are diagrams of semiconductor device according to some embodiments of the present disclosure.

For convenience of explanation, the points different from those described using FIGS. 1 to 7 will be mainly described. For reference, FIG. 10 is a cross-sectional view taken along C-C of FIG. 1, and FIGS. 11 and 12 are cross-sectional views taken along D-D and E-E of FIG. 2.

Referring to FIGS. 10 to 12, the semiconductor device according to some embodiments may further include an epi-spacer 155 extending in the third direction D3, between the first gate spacer 140 and the first source/drain pattern 150.

The epi-spacer 155 may extend along the side walls of the spacer hole 140_H. The epi-spacer 155 may be placed on the first side walls NS1_SW1 of the first sheet pattern.

The epi-spacer 155 may protrude from the first sheet pattern NS1 in the first direction D1. More specifically, the epi-spacer 155 may protrude from the first side wall NS1_SW1 of the first sheet pattern toward the first source/drain pattern 150. The first source/drain pattern 150 may be on and/or cover the side walls of the epi-spacer 155 extending in the first direction D1.

The width W1 of the contact surface 150_CS of the first source/drain pattern in the second direction D2 is smaller than the width of the spacer hole 140_H in the second direction D2.

The epi-spacer 155 defines a part of the first source/drain recess 150R. The lower semiconductor pattern 151 may form a boundary with the epi-spacer 155. The epi-spacer 155 may be in contact with the first gate insulating film 130.

The epi-spacer 155 may overlap the upper surface BP1_US of the first lower pattern. The epi-spacer 155 may not overlap the upper surface of the field insulating film 105.

In some embodiments, the epi-spacer 155 may not extend along an entirety of the upper surface BP1_US of the first lower pattern. The epi-spacer 155 may not extend along the side walls of the uppermost part of the spacer hole 140_H. Unlike the shown configuration, the epi-spacer 155 may also be formed along the entire circumference of the spacer hole 140_H.

The epi-spacer 155 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

Figure 13:
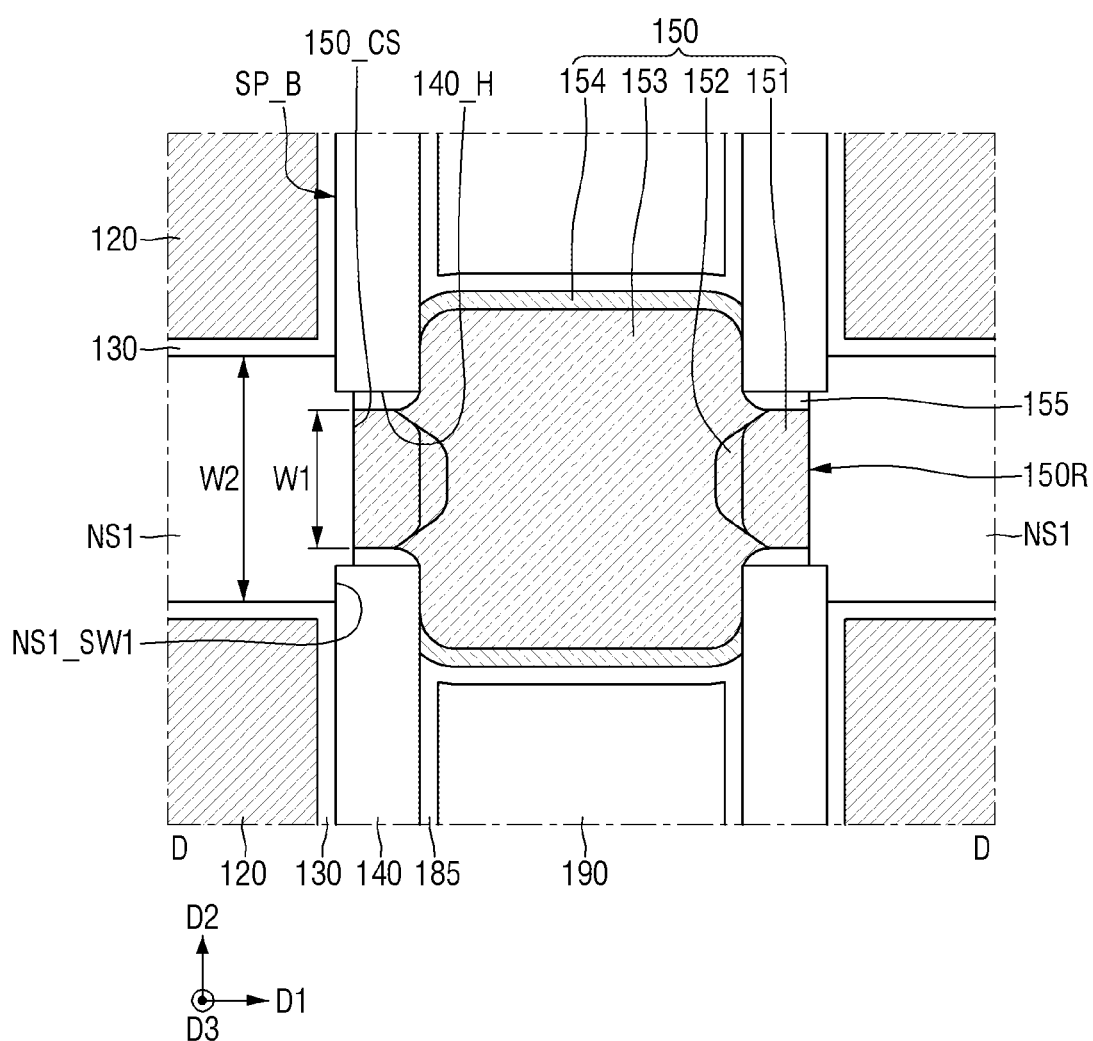
FIGS. 13 and 14 are diagrams of the semiconductor device according to some embodiments of the present disclosure.
Figure 14:
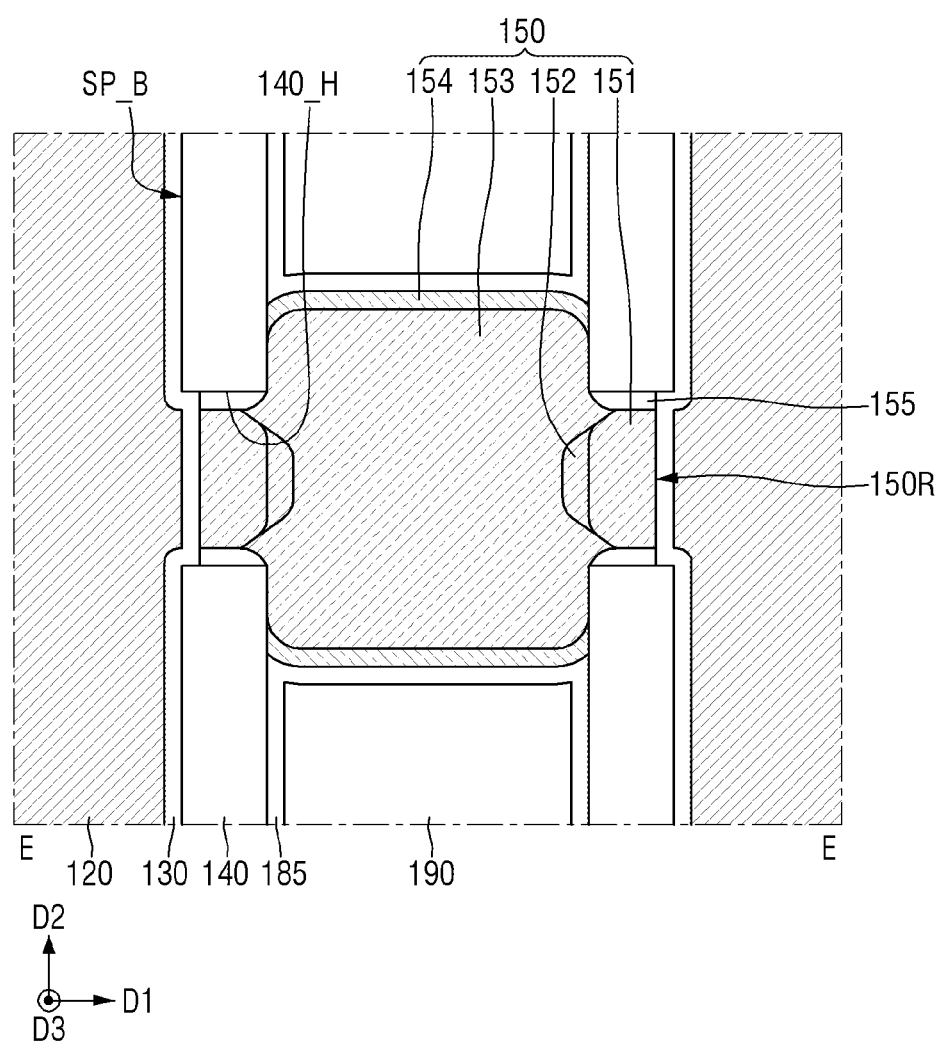

FIGS. 13 and 14 are diagrams of a semiconductor device according to some embodiments of the present disclosure. For convenience of explanation, the points different from those described using FIGS. 10 to 12 will be mainly described. For reference, FIGS. 13 and 14 are cross-sectional views taken along D-D and E-E of FIG. 2.

Referring to FIGS. 13 and 14, in the semiconductor device according to some embodiments, a part of the first sheet pattern NS1 may protrude in the first direction D1 beyond the spacer boundary SP_B.

A part of the first sheet pattern NS1 may be placed inside the spacer hole 140_H. A part of the first sheet pattern NS1 may overlap the first gate spacer 140 in the second direction D2.

The contact surface 150_CS of the first source/drain pattern may be closer to the filling semiconductor pattern 153 than the spacer boundary SP_B. The contact surface 150_CS of the first source/drain pattern may be located inside the spacer hole 140_H.

A part of the first gate insulating film 130 which is in contact with the first source/drain pattern 150 may be placed inside the spacer hole 140_H.

Figure 15:
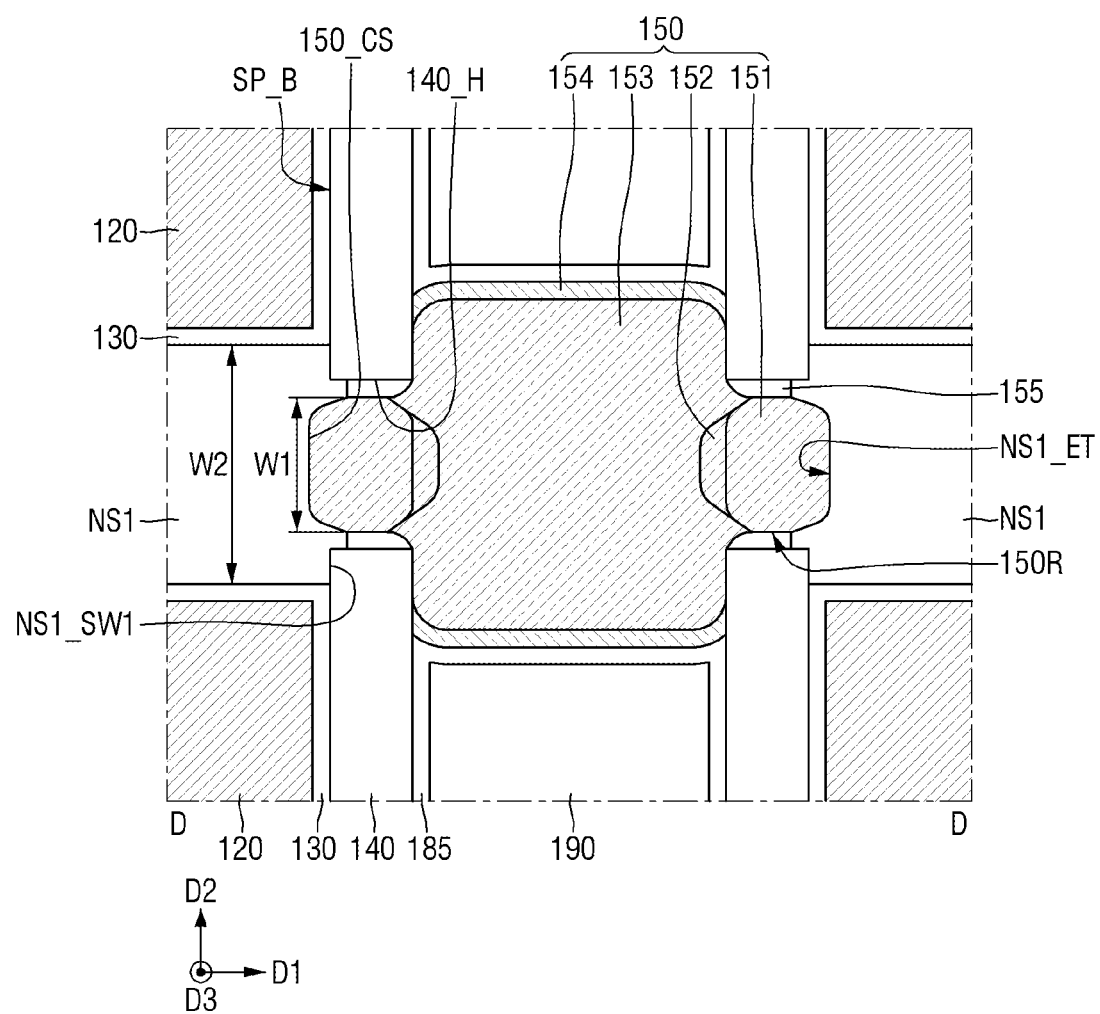
FIG. 15 is a diagram of the semiconductor device according to some embodiments of the present disclosure.

FIG. 15 is a diagram of a semiconductor device according to some embodiments of the present disclosure. For convenience of explanation, the points different from those described using FIGS. 13 and 14 will be mainly described. For reference, FIG. 15 is a cross-sectional view taken along D-D of FIG. 2.

Referring to FIG. 15, in the semiconductor device according to some embodiments, each of the first sheet patterns NS1 may further include an epi-trench NS1_ET that penetrates in the first direction D1 from the boundary between the first side wall NS1_SW1 of the first sheet pattern and the epi-spacer 155.

The epi-trench NS1_ET may be placed at the termination NS1_EP of the first sheet pattern. A part of the first source/drain pattern 150 may be in and/or fill the epi-trench NS1_ET. Although a part of the first source/drain pattern 150 that fills the epi-trench NS1_ET is shown not to overlap the first gate spacer 140 in the second direction D2, the embodiments of the present disclosure are not limited thereto. Unlike the shown configuration, the first source/drain pattern 150 that fills the epi-trench NS1_ET may be placed entirely between the spacer holes 140_H.

Figure 16:
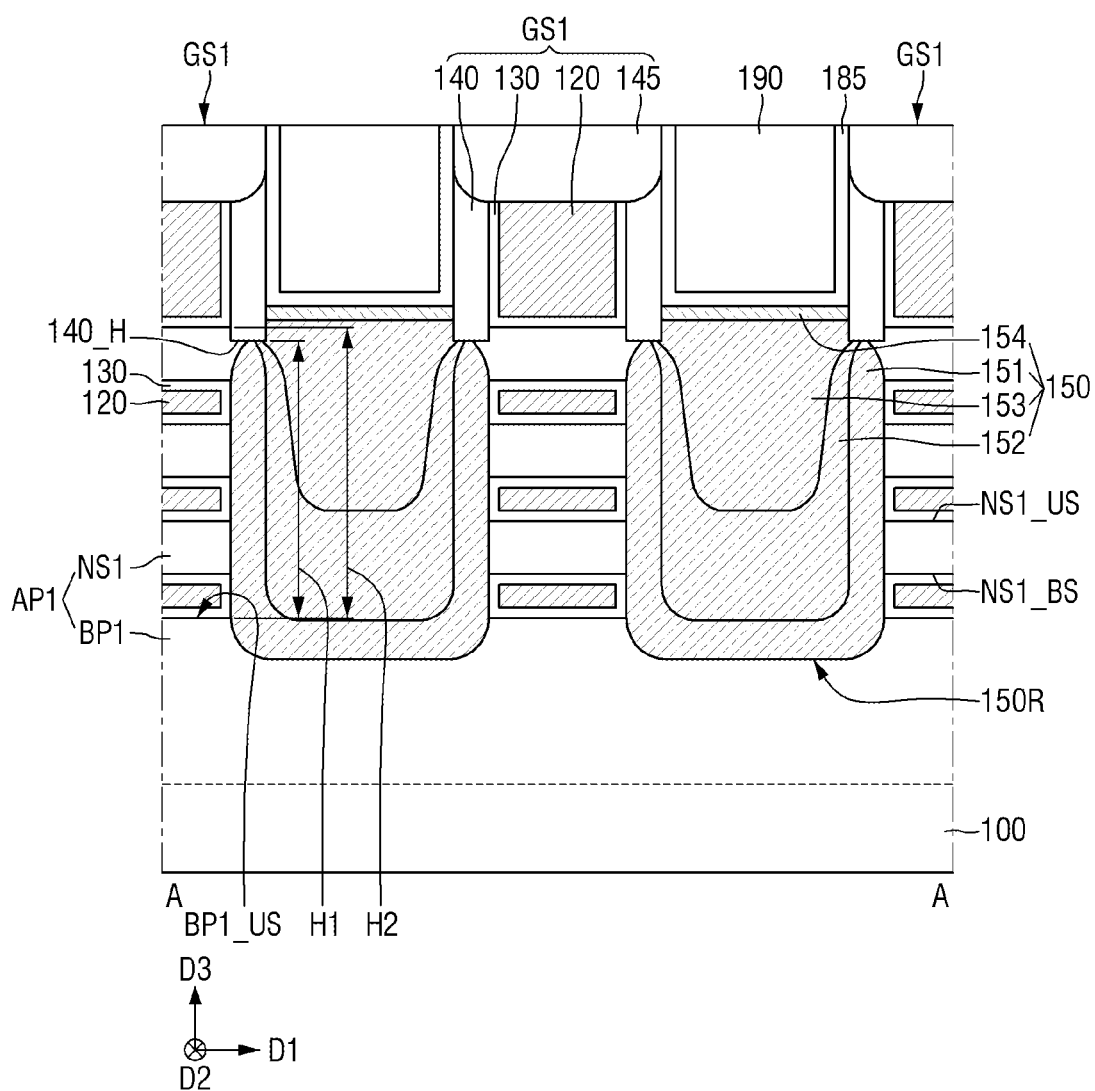
FIG. 16 is a diagram of the semiconductor device according to some embodiments of the present disclosure.

FIG. 16 is a diagram of a semiconductor device according to some embodiments of the present disclosure. For convenience of explanation, the points different from those described using FIGS. 1 to 7 will be mainly described. For reference, FIG. 16 is a cross-sectional view taken along A-A of FIG. 1.

Referring to FIG. 16, in the semiconductor device according to some embodiments, an upper surface NS1_US of the first uppermost sheet pattern placed at the uppermost part among the first sheet patterns NS1 is higher than the uppermost part of the spacer hole 140_H.

A height H2 from the upper surface BP1_US of the first lower pattern to the upper surface NS1_US of the first uppermost sheet pattern is greater than a height H1 from the upper surface BP1_US of the first lower pattern to the uppermost part of the spacer hole 140_H.

Figure 17:
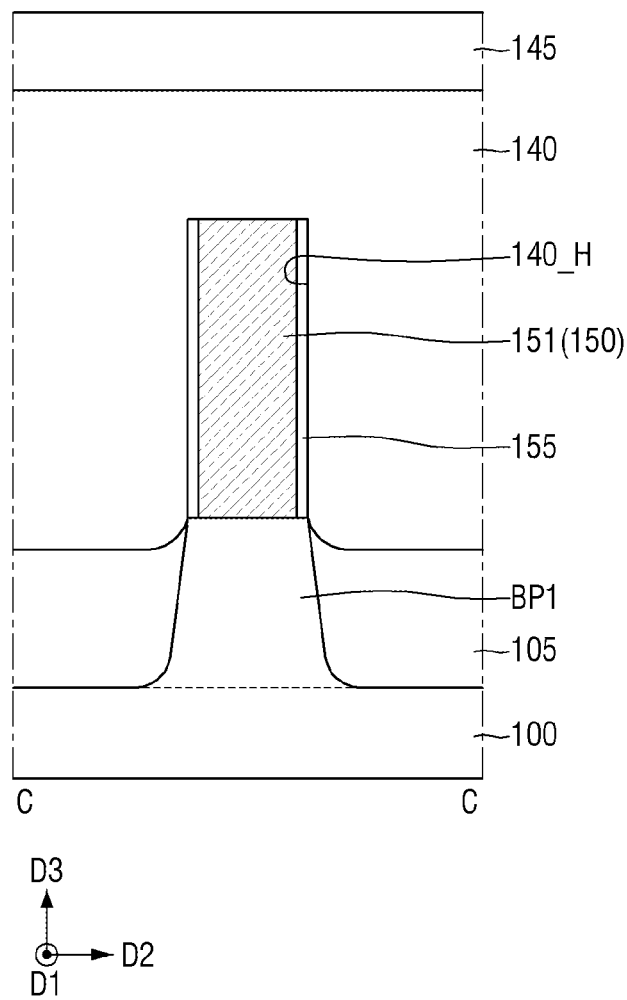
FIGS. 17 to 19 are diagrams of the semiconductor device according to some embodiments of the present disclosure.
Figure 18:
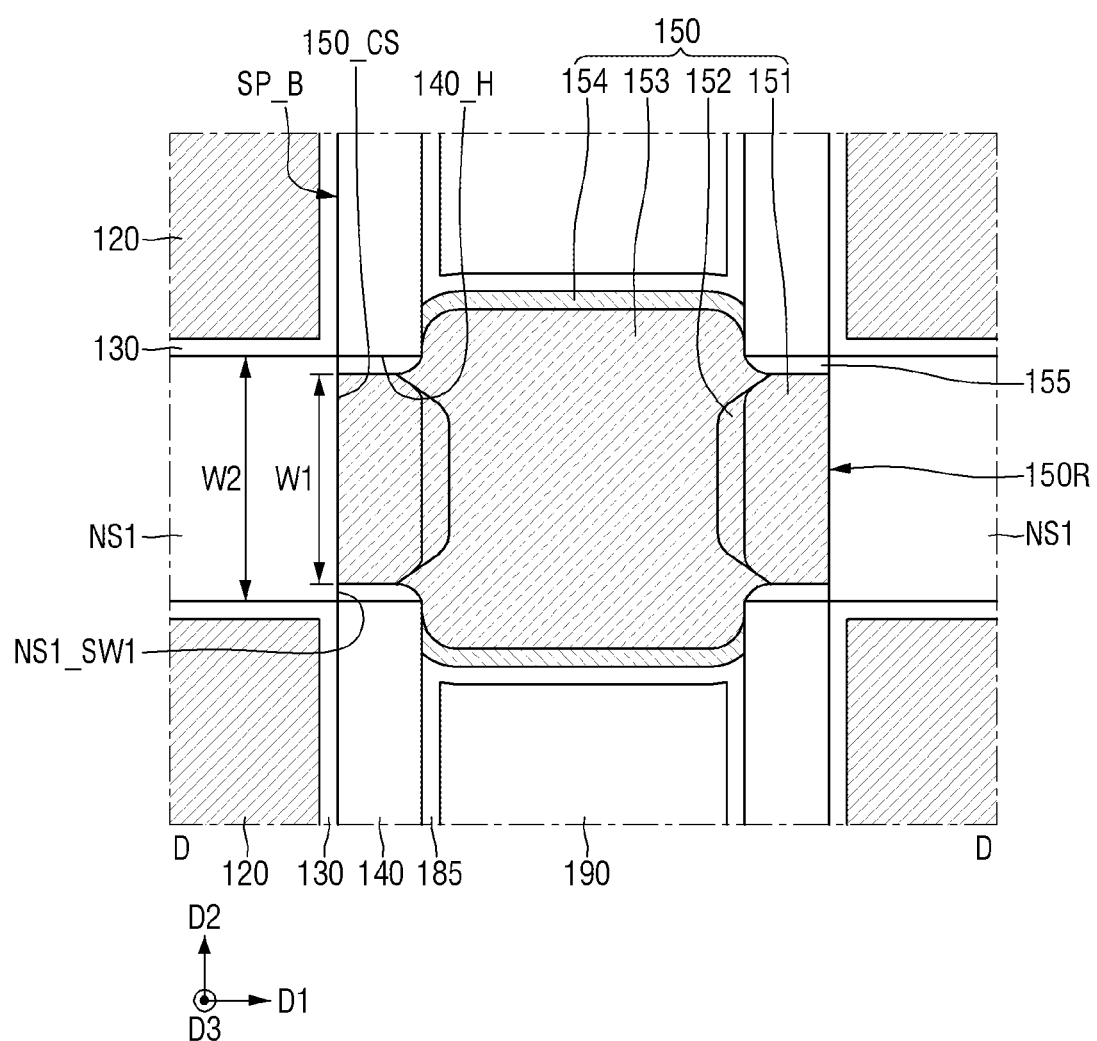
Figure 19:
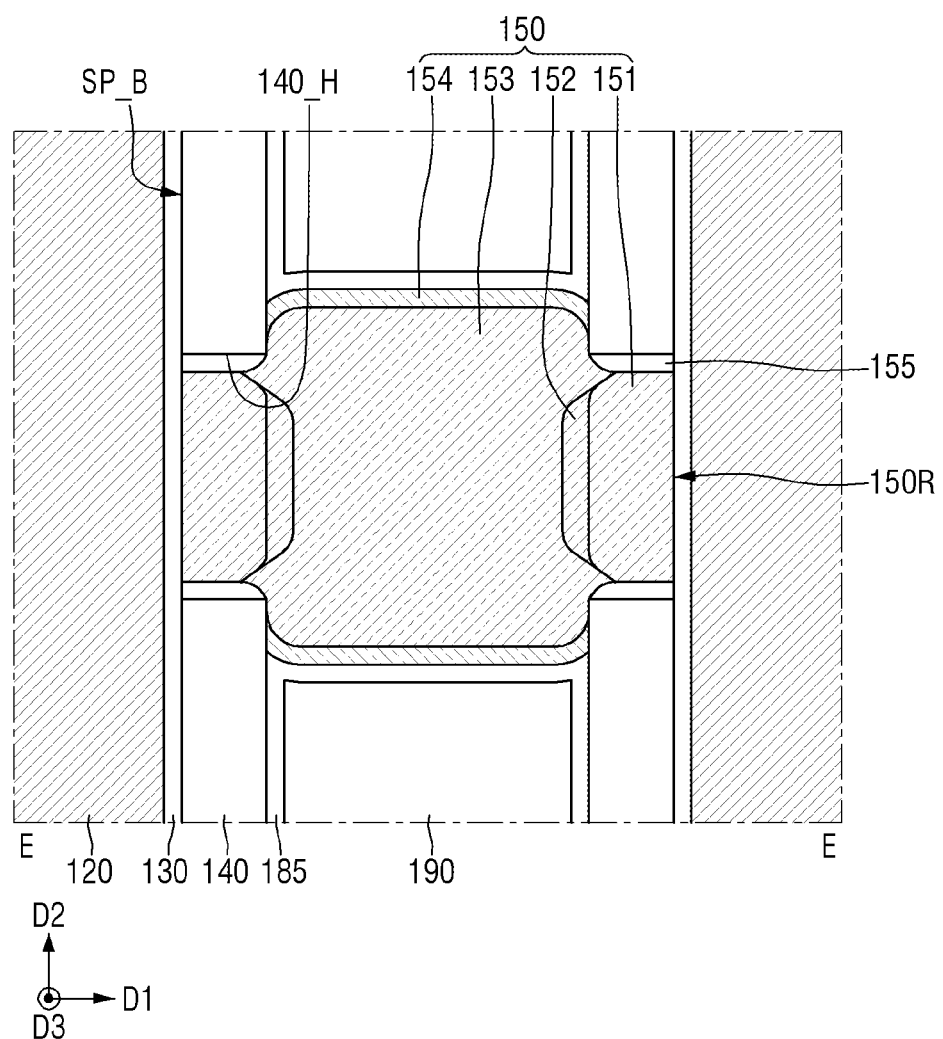

FIGS. 17 to 19 are diagrams of a semiconductor device according to some embodiments of the present disclosure. For convenience of explanation, the points different from those described using FIGS. 1 to 7 will be mainly described. FIG. 17 is a cross-sectional view taken along C-C of FIG. 1, and FIGS. 18 and 19 are cross-sectional views taken along D-D and E-E of FIG. 2.

Referring to FIGS. 17 to 19, the semiconductor device according to some embodiments further includes an epi-spacer 155 extending in the third direction D3, between the first gate spacer 140 and the first source/drain pattern 150. The first gate spacer 140 may not overlap the first sheet pattern NS1 in the first direction D1.

For example, the width of the spacer hole 140_H in the second direction D2 may be the same as the width of the upper surface BP1_US of the first lower pattern in the second direction D2. In some embodiments, the first gate spacer 140 may not span the upper surface BP1_US of the first lower pattern.

The first gate spacer 140 may not be on and/or cover the first side wall NS1_SW1 of the first sheet pattern. The width of the spacer hole 140_H in the second direction D2 may be the same as the width W2 of the first sheet pattern NS1 in the second direction D2.

The epi-spacer 155 may extend along the side walls of the spacer hole 140_H. The epi-spacer 155 may be placed on the first side wall NS1_SW1 of the first sheet pattern. The epi-spacer 155 may protrude from the first sheet pattern NS1 in the first direction D1. The first source/drain pattern 150 may be on and/or cover the side walls of the epi-spacer 155 extending in the first direction D1.

The epi-spacer 155 may define a part of the first source/drain recess 150R. The lower semiconductor pattern 151 may forms\ a boundary with the epi-spacer 155. The epi-spacer 155 may be in contact with the first gate insulating film 130.

The epi-spacer 155 may overlap the upper surface BP1_US of the first lower pattern. The epi-spacer 155 may not overlap the upper surface of the field insulating film 105.

In some embodiments, the epi-spacer 155 may not extend along the entirety of the upper surface BP1_US of the first lower pattern. The epi-spacer 155 may not extend along the side walls of the uppermost part of the spacer hole 140_H. Unlike the shown configuration, the epi-spacer 155 may also be formed along the entire circumference of the spacer hole 140_H.

Figure 20:
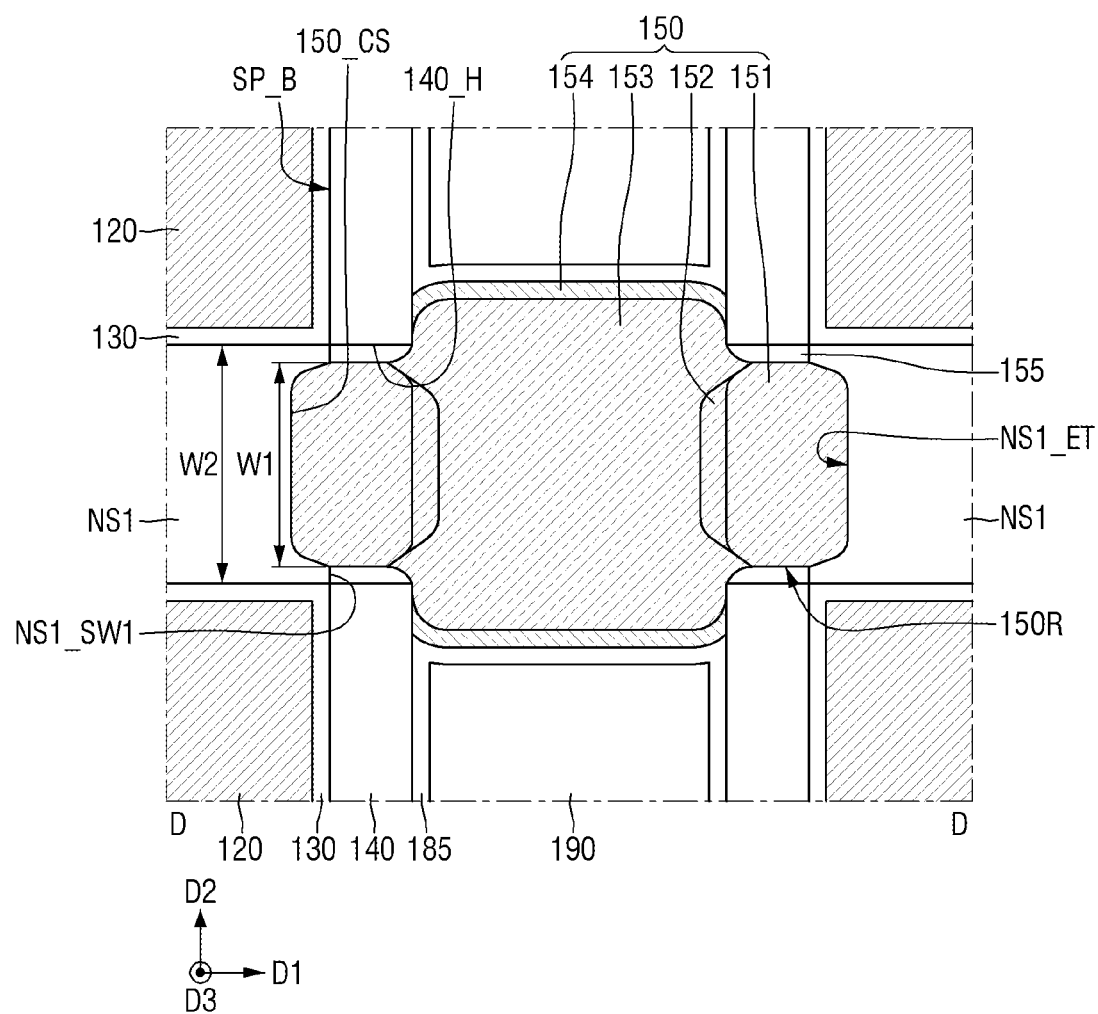
FIGS. 20 and 21 are diagrams of the semiconductor device according to some embodiments of the present disclosure.
Figure 21:
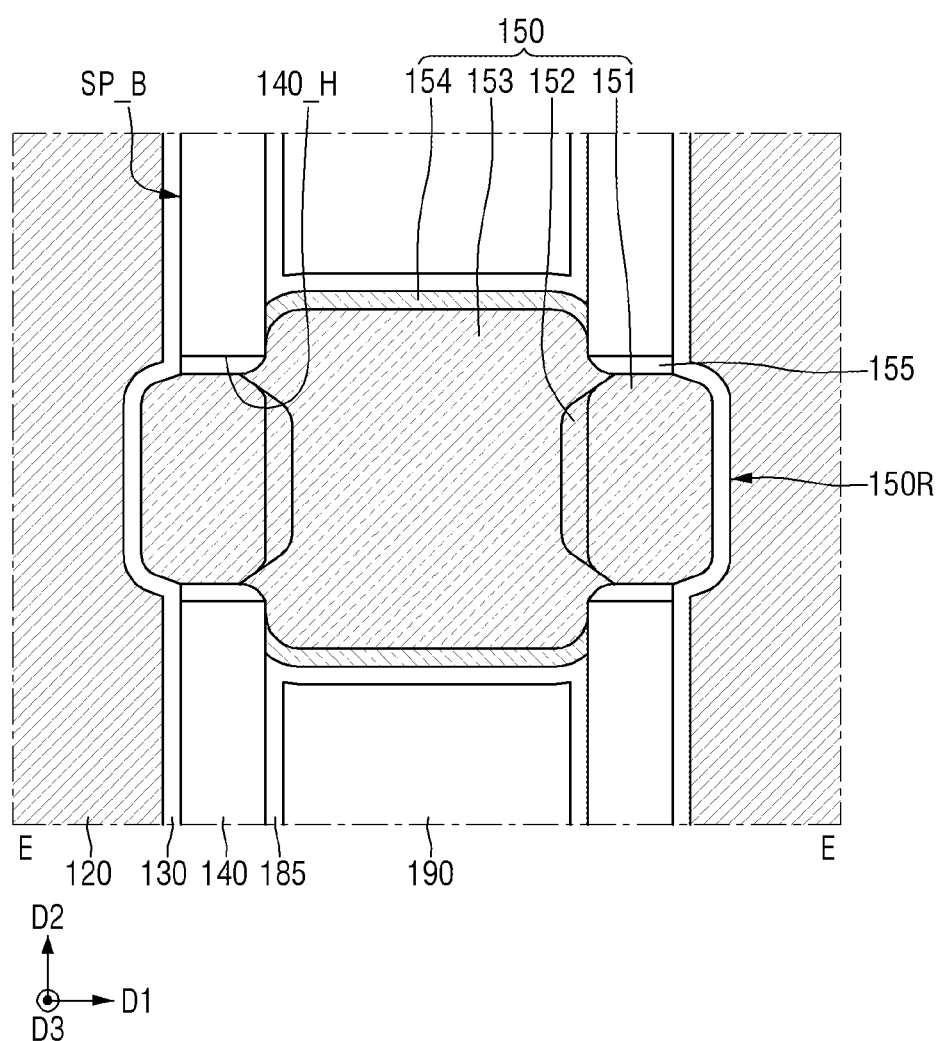

FIGS. 20 and 21 are diagrams of a semiconductor device according to some embodiments of the present disclosure. For convenience of explanation, the points different from those described using FIGS. 17 to 19 will be mainly described. For reference, FIGS. 20 and 21 are cross-sectional views taken along D-D and E-E of FIG. 2.

Referring to FIGS. 20 and 21, in the semiconductor device according to some embodiments, each first sheet pattern NS1 may further include an epi-trench NS1_ET placed at the termination NS1_EP of the first sheet pattern.

The epi-trench NS1_ET may be formed on the first side wall NS1_SW1 of the first sheet pattern. The epi-trench NS1_ET may penetrate in the first direction D1 from the boundary between the first sheet pattern NS1 and the epi-spacer 155.

The first source/drain pattern 150 may be in and/or fill the epi-trench NS1_ET. For example, the lower semiconductor pattern 151 may fill the epi-trench NS1_ET.

Figure 22:
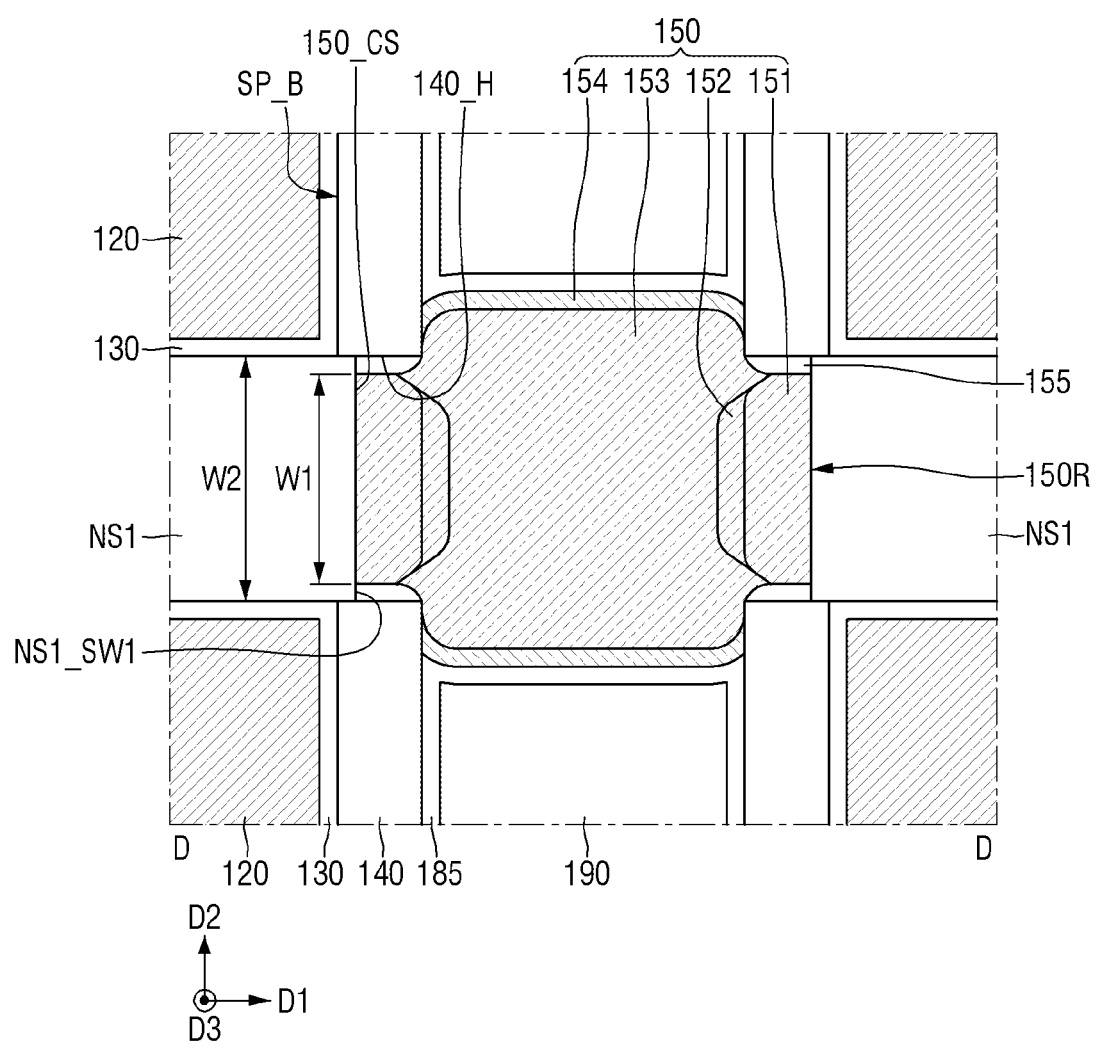
FIGS. 22 and 23 are diagrams of the semiconductor device according to some embodiments of the present disclosure.
Figure 23:
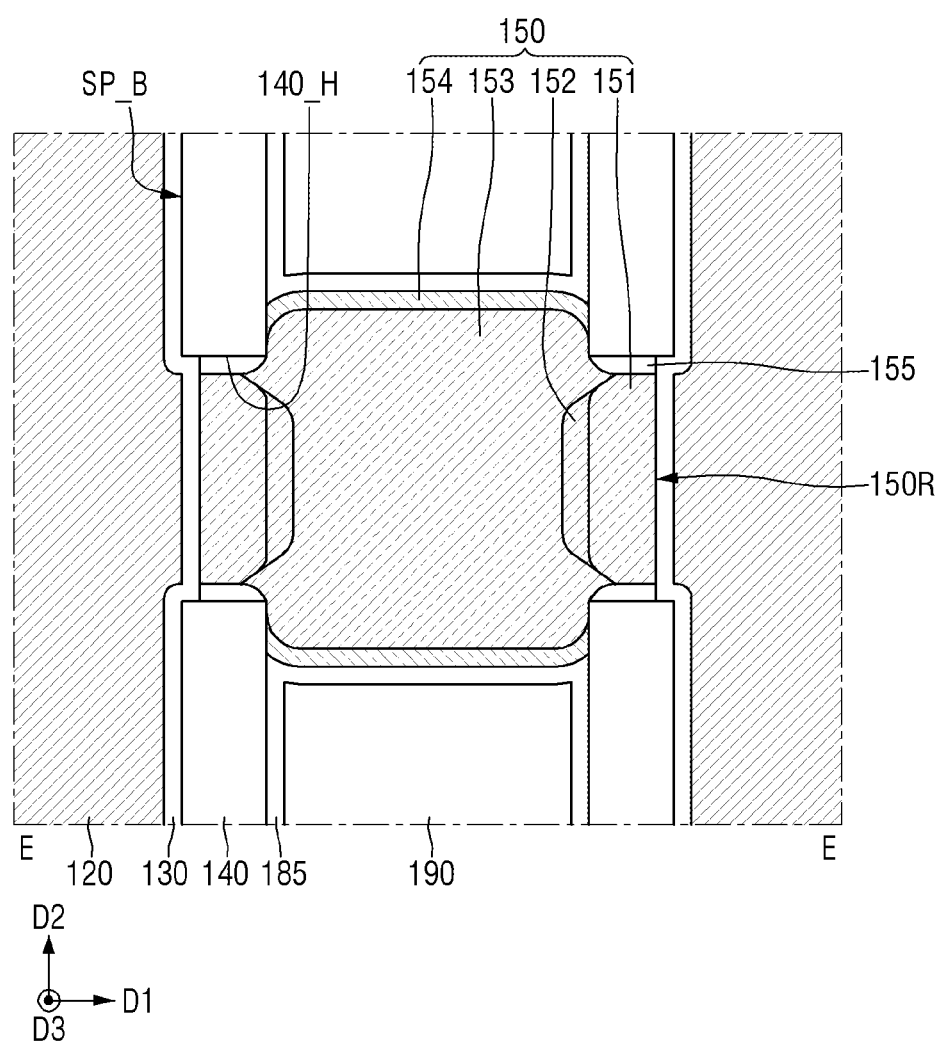

FIGS. 22 and 23 are diagrams of a semiconductor device according to some embodiments of the present disclosure. For convenience of explanation, the points different from those described using FIGS. 17 to 19 will be mainly described. For reference, FIGS. 22 and 23 are cross-sectional views taken along D-D and E-E of FIG. 2.

Referring to FIGS. 22 and 23, in the semiconductor device according to some embodiments, a part of the first sheet pattern NS1 may be placed in the spacer hole 140_H.

A part of the first sheet pattern NS1 may overlap the first gate spacer 140 in the second direction D2. A part of the first sheet pattern NS1 may protrude in the first direction D1 from the spacer boundary SP_B.

The contact surface 150_CS of the first source/drain pattern may be closer to the filling semiconductor pattern 153 than the spacer boundary SP_B. The contact surface 150_CS of the first source/drain pattern may be located inside the spacer hole 140_H. A part of the first gate insulating film 130 which is in contact with the first source/drain pattern 150 may be placed inside the spacer hole 140_H.

Figure 24:
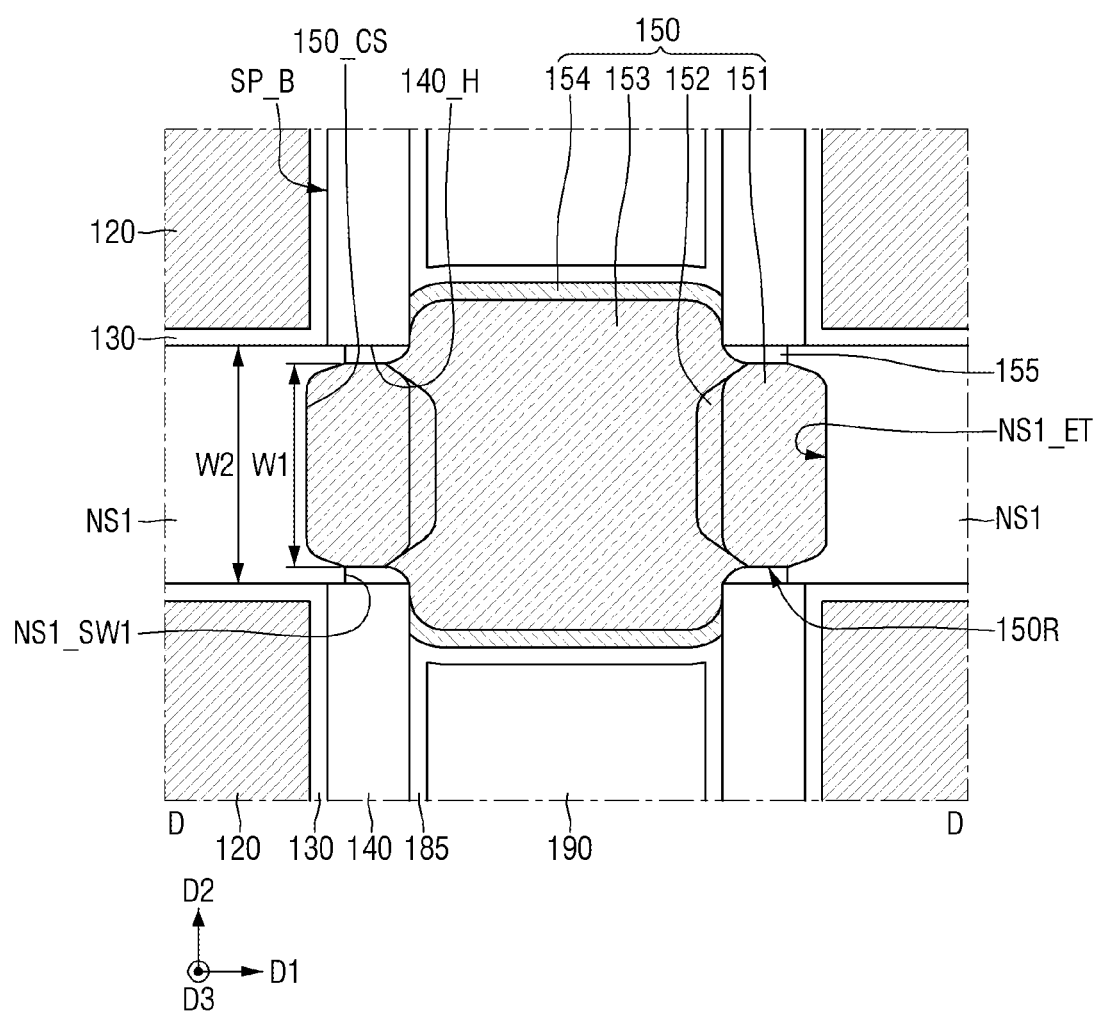
FIGS. 24 and 25 are diagrams of the semiconductor device according to some embodiments of the present disclosure.
Figure 25:
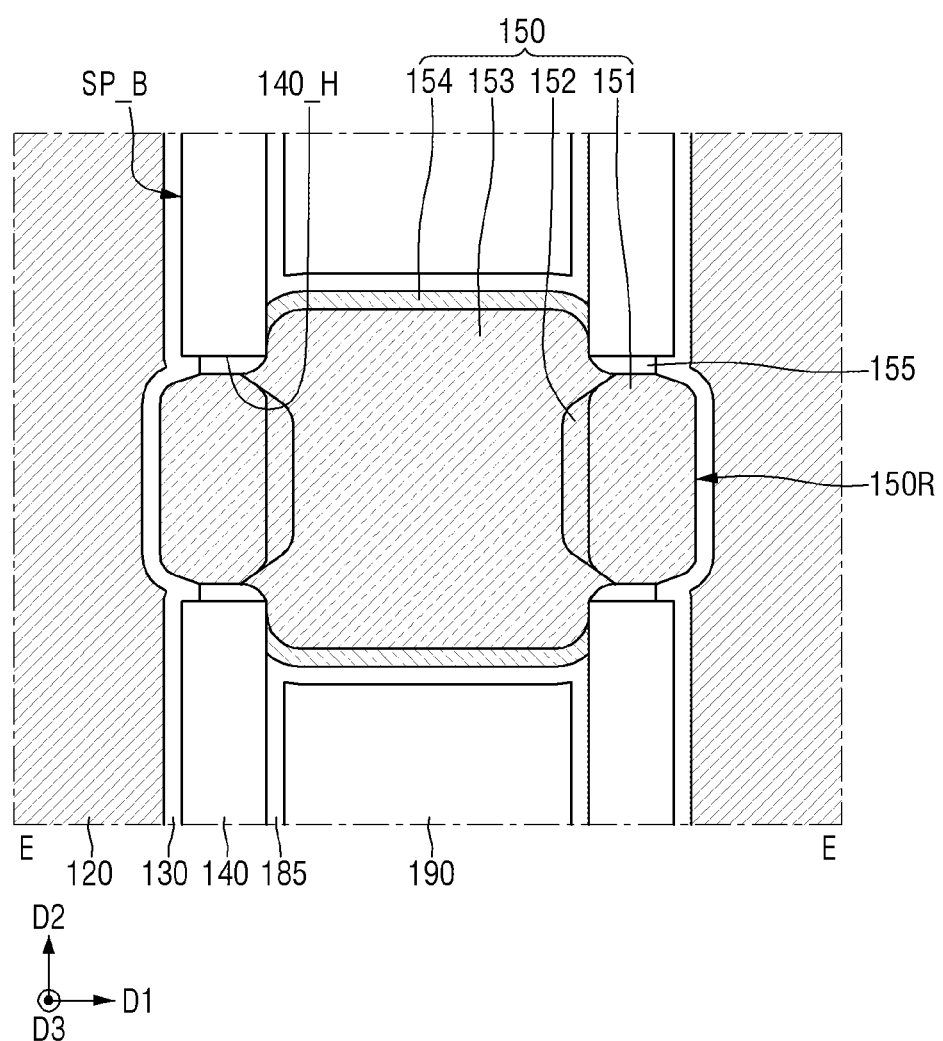

FIGS. 24 and 25 are diagrams for explaining a semiconductor device according to some embodiments. For convenience of explanation, the points different from those described using FIGS. 22 and 23 will be mainly described. For reference, FIGS. 24 and 25 are cross-sectional views taken along D-D and E-E of FIG. 2.

Referring to FIGS. 24 and 25, in the semiconductor device according to some embodiments, each first sheet pattern NS1 may further include an epi-trench NS1_ET which penetrates in the first direction D1 from the boundary between the first side wall NS1_SW1 of the first sheet pattern and the epi-spacer 155.

Although a part of the first source/drain pattern 150 that is within the epi-trench NS1_ET is shown not to overlap the first gate spacer 140 in the second direction D2, the embodiment is not limited thereto. Unlike the shown configuration, the first source/drain pattern 150 that is in and/or fills the epi-trench NS1_ET may be placed entirely between the spacer holes 140_H (e.g., between the sidewalls of one or more of the spacer holes 140_H).

Figure 26:
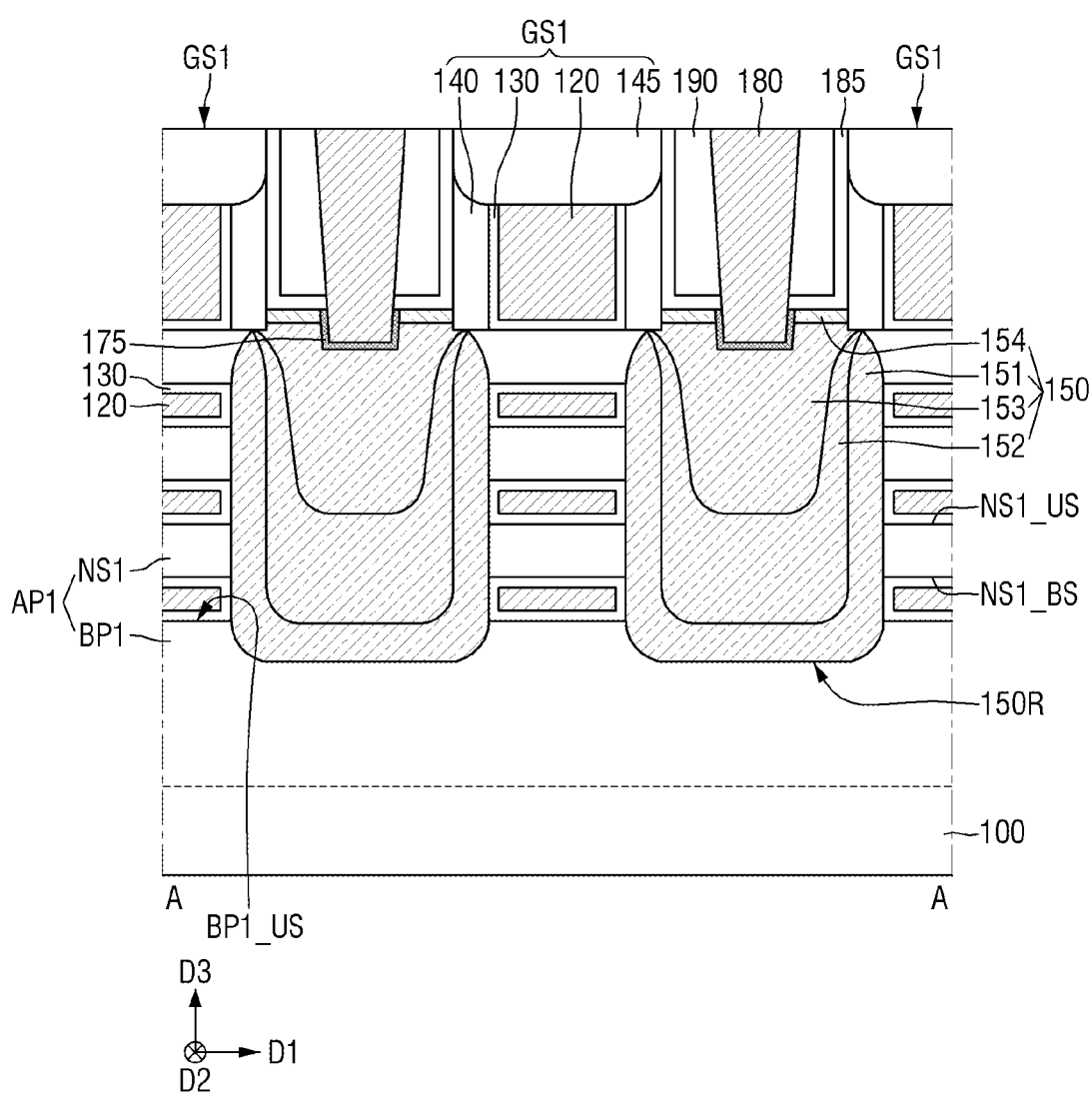
FIGS. 26 and 27 are diagrams of the semiconductor device according to some embodiments of the present disclosure, respectively.
Figure 27:
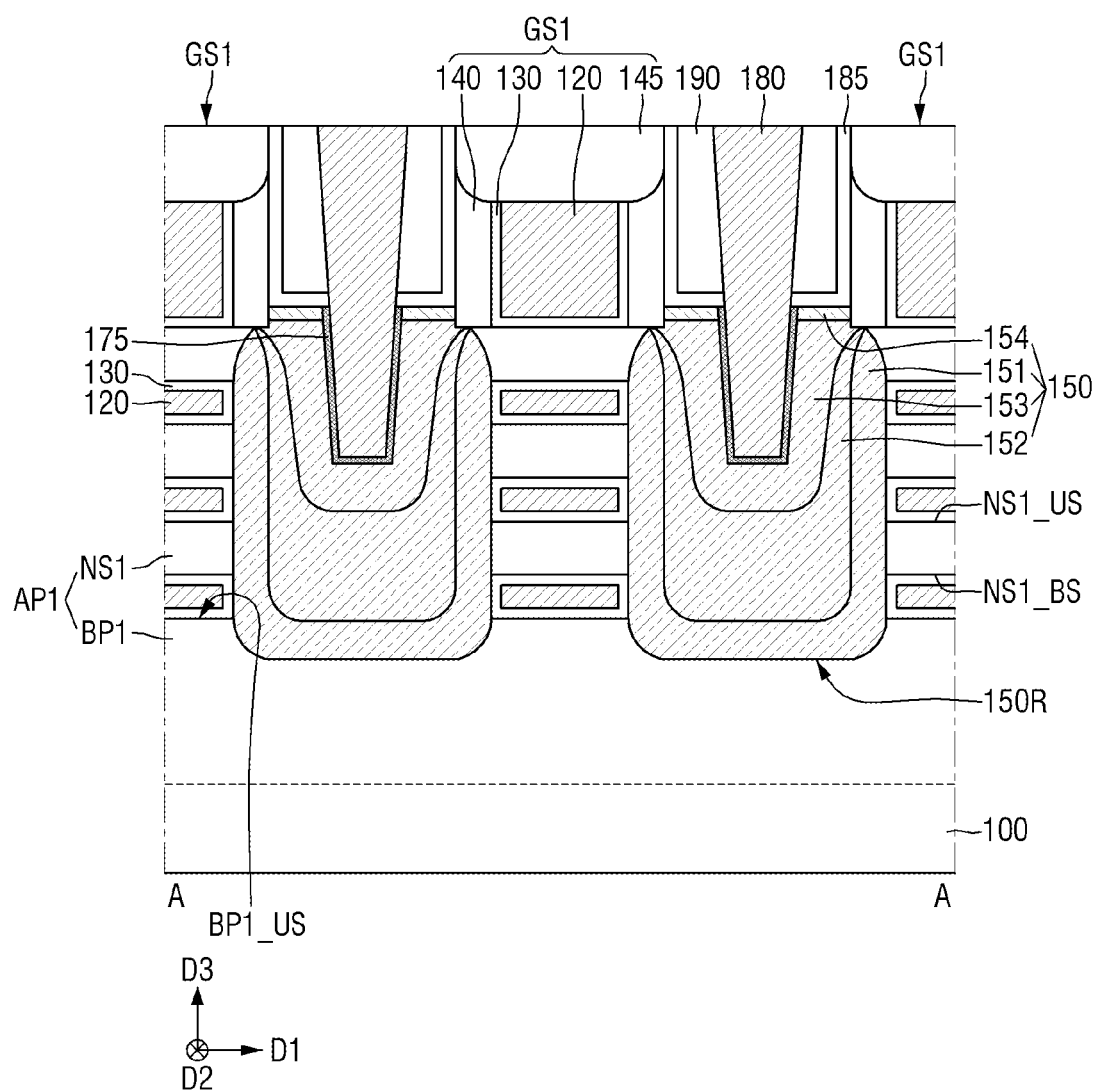

FIGS. 26 and 27 are diagrams of a semiconductor device according to some embodiments, respectively. For convenience of explanation, the points different from those described using FIGS. 1 to 7 will be mainly described. For reference, FIGS. 26 and 27 are cross-sectional views taken along A-A of FIG. 1.

Referring to FIGS. 26 and 27, the semiconductor device according to some embodiments may further include a source/drain contact 180 placed on the first source/drain pattern 150.

The source/drain contact 180 is connected to (e.g., electrically connected to) the first source/drain pattern 150. The source/drain contact 180 may pass through the interlayer insulating film 190 and the etching stop film 185, and may be connected to the first source/drain pattern 150.

A metal silicide film 175 may be further placed between the source/drain contact 180 and the first source/drain pattern 150.

In FIG. 26, the bottom surface of the source/drain contact 180 may be higher than the lower surface NS1_BS of the first nanosheet placed at the uppermost part among the first sheet patterns NS1.

In FIG. 27, the bottom surface of the source/drain contact 180 may be located between the lower surface NS1_BS of the first sheet pattern placed at the lowermost part among the first sheet patterns NS1 and the lower surface NS1_BS of the first sheet pattern placed at the uppermost part among the first sheet patterns NS1.

Although the source/drain contact 180 is shown as a single film, this is only for convenience of explanation, and the embodiments of the present disclosure are not limited thereto. The source/drain contact 180 may include, for example, at least one of metal, metal alloy, conductive metal nitride, conductive metal carbide, conductive metal oxide, conductive metal carbonitride, and/or two-dimensional (2D) material.

The metal silicide film 175 may include metal silicide.

Figure 28:
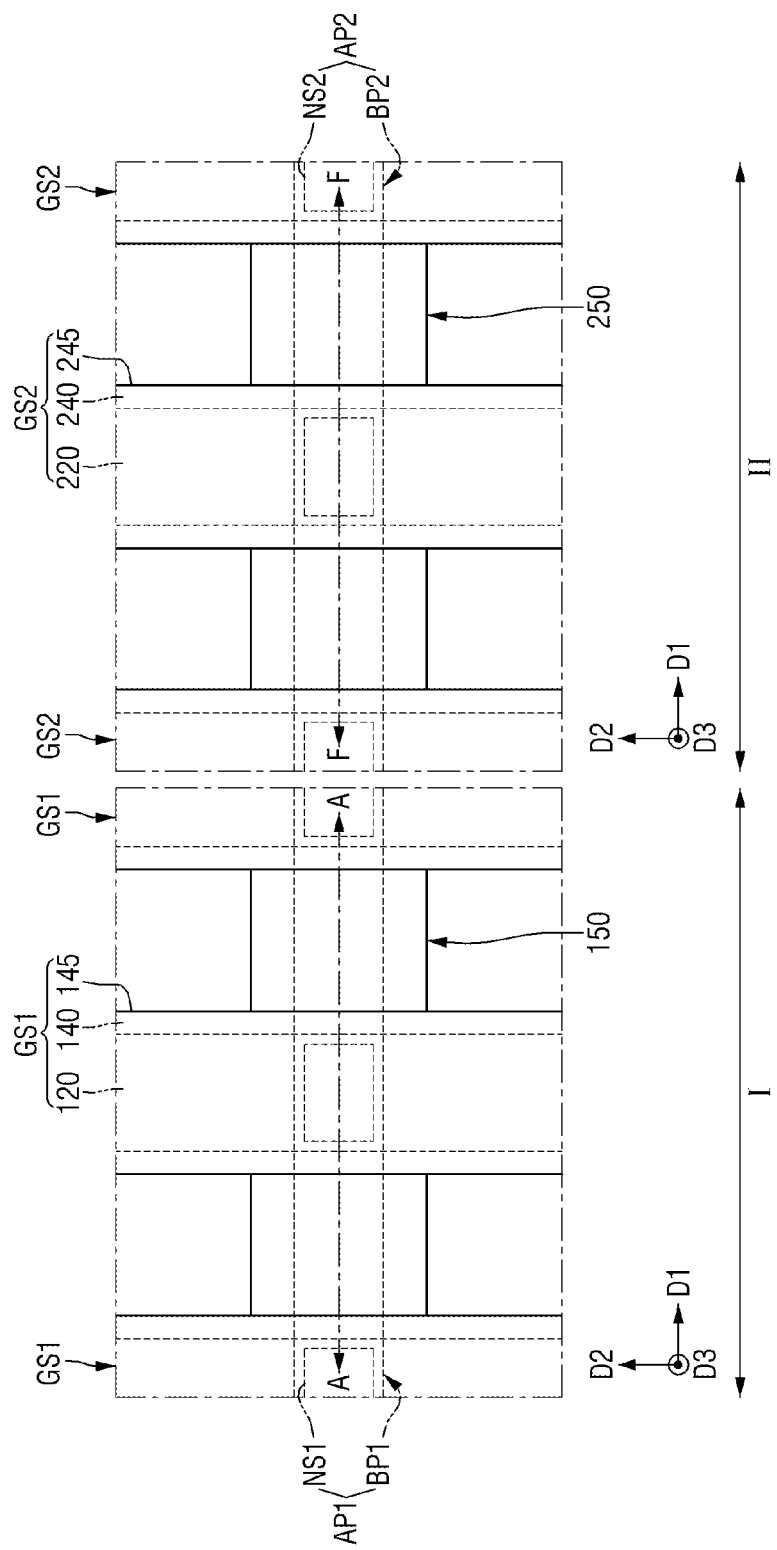
FIG. 28 is an example plan view of a semiconductor device according to some embodiments of the present disclosure.
Figure 29:
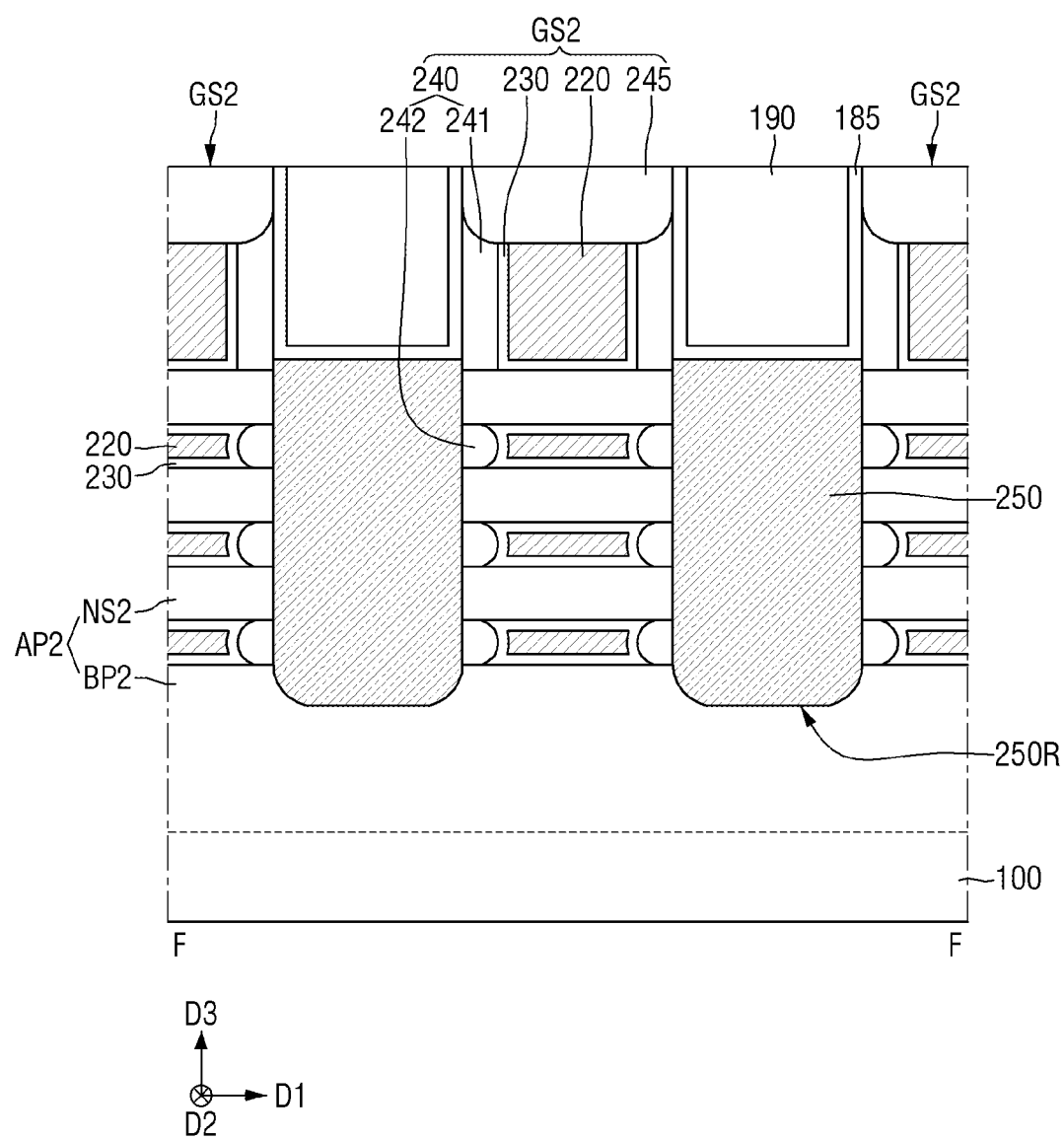
FIGS. 29 and 30 are cross-sectional views taken along F-F of FIG. 28.
Figure 30:
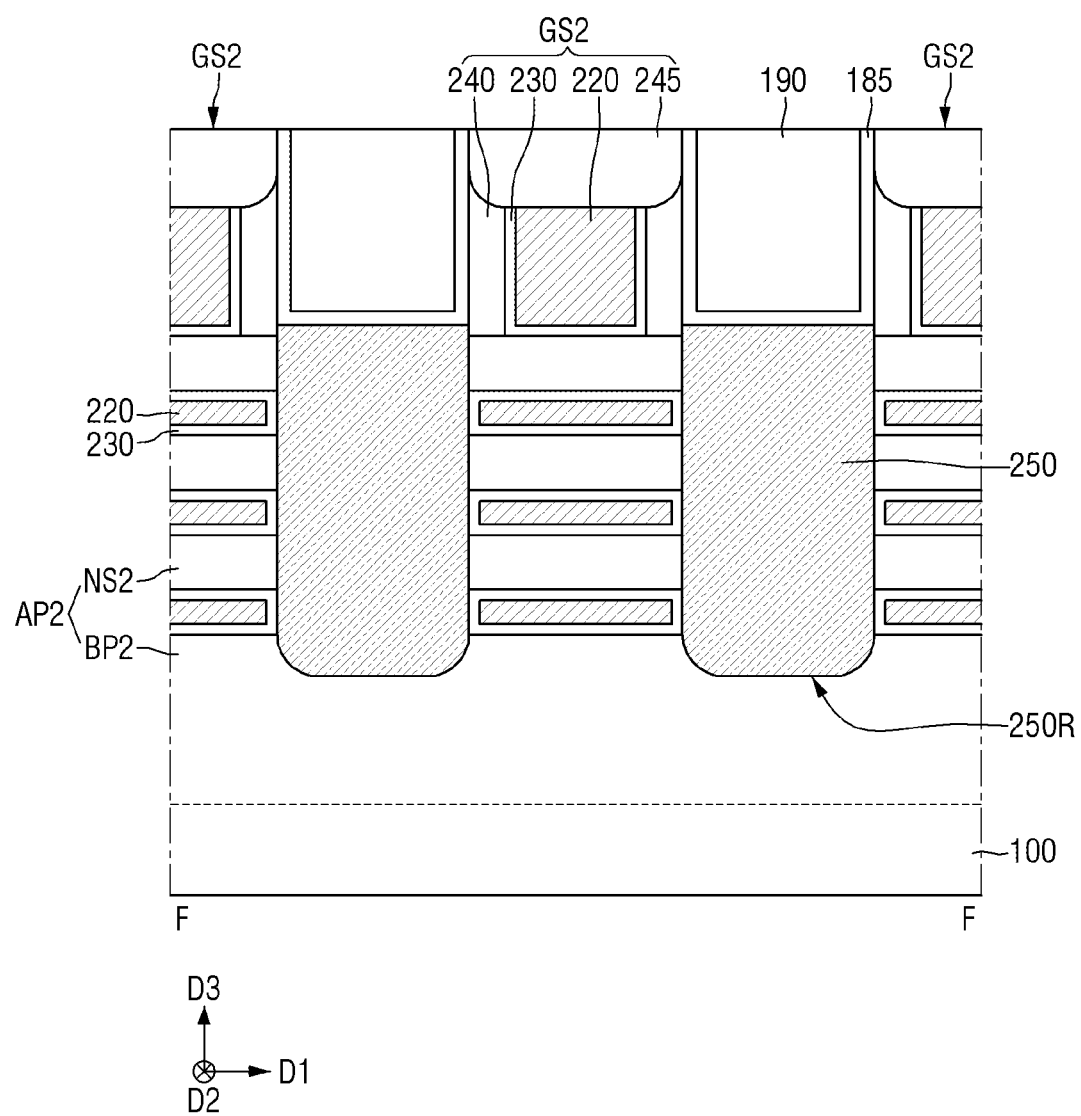

FIG. 28 is an example plan view of a semiconductor device according to some embodiments of the present disclosure. FIGS. 29 and 30 are cross-sectional views taken along F-F of FIG. 28.

For reference, the cross-sectional view taken along A-A of FIG. 28 may be the same as one of FIGS. 2 and 16. In addition, the description of a first region I of FIG. 28 may be substantially the same as that described using FIGS. 1 to 25. Therefore, the following description will focus on the content relating to a second region II of FIG. 28.

Referring to FIGS. 28 to 30, the semiconductor device according to some embodiments may include a first active pattern AP1, a plurality of first gate structures GS1, a first source/drain pattern 150, a second active pattern AP2, a plurality of second gate structures GS2, and a second source/drain pattern 250.

The substrate 100 may include a first region I and a second region II. The first region I may be a region in which a PMOS device is formed, and the second region II may be a region in which an NMOS device is formed.

The first active pattern AP1, the plurality of first gate structures GS1, and the first source/drain pattern 150 may be placed in the first region I of the substrate 100. The second active pattern AP2, the plurality of second gate structures GS2, and the second source/drain pattern 250 may be placed in the second region II of the substrate 100.

The second active pattern AP2 may include a second lower pattern BP2 and a plurality of second sheet patterns NS2. The second lower pattern BP2 may protrude from the substrate 100. The second lower pattern BP2 may extend long in (e.g., have a longitudinal axis extending in) the first direction D1. A plurality of second sheet patterns NS2 may be placed on the second lower pattern BP2. The plurality of second sheet patterns NS2 may be spaced apart from the second lower pattern BP2 in the third direction D3.

The second lower pattern BP2 and the second sheet pattern NS2 may include one of silicon or germanium, which is an elemental semiconductor material, a group IV-IV compound semiconductor, or a group compound semiconductor. In the semiconductor device according to some embodiments, the second lower pattern BP2 may be a silicon lower pattern including silicon, and the second sheet pattern NS2 may be a silicon sheet pattern including silicon.

The plurality of second gate structures GS2 may be placed on the substrate 100. Each second gate structure GS2 may extend in the second direction D2. Adjacent second gate structures GS2 may be spaced apart from each other in the first direction D1.

The second gate structure GS2 may be placed on the second active pattern AP2. The second gate structure GS2 may intersect the second active pattern AP2. The second gate structure GS2 may be on and/or intersect the second lower pattern BP2. The second gate structure GS2 may surround each second sheet pattern NS2.

The second gate structure GS2 may include, for example, a second gate electrode 220, a second gate insulating film 230, a second gate spacer 240, and a second gate capping pattern 245.

In FIG. 29, the second gate spacer 240 may include an outer spacer 241 and an inner spacer 242, unlike the first gate spacer 140. The inner spacer 242 may be placed between the second sheet patterns NS2 adjacent to each other in the third direction D3. The inner spacer 242 may be in contact with the second gate insulating film 230. The inner spacer 242 may define a part of a second source/drain recess 250R.

In FIG. 30, the second gate spacer 240 does not include an inner spacer, like the first gate spacer 140. That is, the second gate insulating film 230 may be in contact with the second source/drain pattern 250.

The description of the second gate electrode 220, the second gate insulating film 230, the second gate spacer 240, and the second gate capping pattern 245 is substantially the same as the description of the first gate electrode 120, the first gate insulating film 130, the first gate spacer 140, and the first gate capping pattern 145, and therefore, will not be provided below.

The second source/drain pattern 250 may be formed on the second active pattern AP2. The second source/drain pattern 250 may be formed on the second lower pattern BP2. The second source/drain pattern 250 may be connected to (e.g., in contact with) the second sheet pattern NS2.

The second source/drain pattern 250 may be placed on the side surface of the second gate structure GS2. The second source/drain pattern 250 may be placed between the second gate structures GS2 adjacent to each other in the first direction D1. For example, the second source/drain pattern 250 may be placed on either side of the second gate structure GS2. Unlike the shown configuration, the second source/drain pattern 250 is placed on one side of the second gate structure GS2, and may not be placed on the other side of the second gate structure GS2.

The second source/drain pattern 250 may be included in a source/drain of a transistor that uses the second sheet pattern NS2 as a channel region.

The second source/drain pattern 250 may be placed inside the second source/drain recess 250R. A bottom surface of the second source/drain recess 250R may be defined by the second lower pattern BP2. The side walls of the second source/drain recess 250R may be defined by the second nanosheet NS2 and the second gate structure GS2.

The second source/drain pattern 250 may include silicon doped with n-type impurities. The n-type impurities may be, but are not limited to, for example, phosphorus (P) or arsenic (As).

As in FIG. 30, when the second source/drain pattern 250 is in contact with the second gate insulating film 230, unlike the aforementioned configuration, the second source/drain pattern 250 may include a silicon-germanium liner that extends along the profile of the second source/drain recess 250R. The second source/drain pattern 250 may include silicon doped with n-type impurities, on the silicon-germanium liner.

FIGS. 31 to 38 are intermediate stage diagrams for explaining a method for fabricating the semiconductor device according to some embodiments of the present disclosure. For reference, FIGS. 31, 34, 36 and 37 may be cross-sectional views taken along A-A of FIG. 1. FIGS. 32, 33, 35 and 38 may be cross-sectional views taken along E-E of FIGS. 31, 34 and 37.

Figure 31:
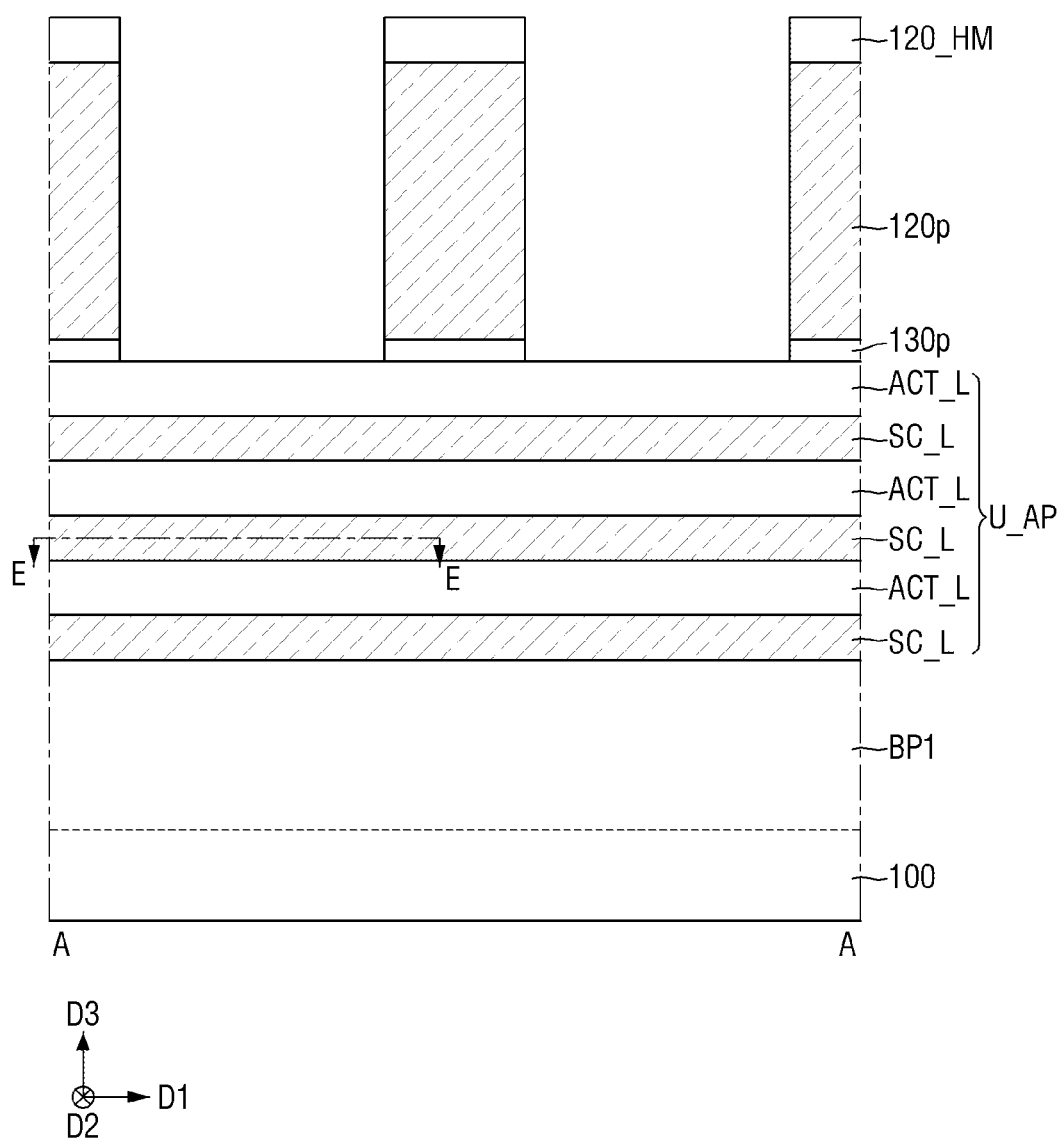
FIGS. 31 to 38 are intermediate stage diagrams for explaining a method for fabricating a semiconductor device according to some embodiments of the present disclosure.
Figure 32:
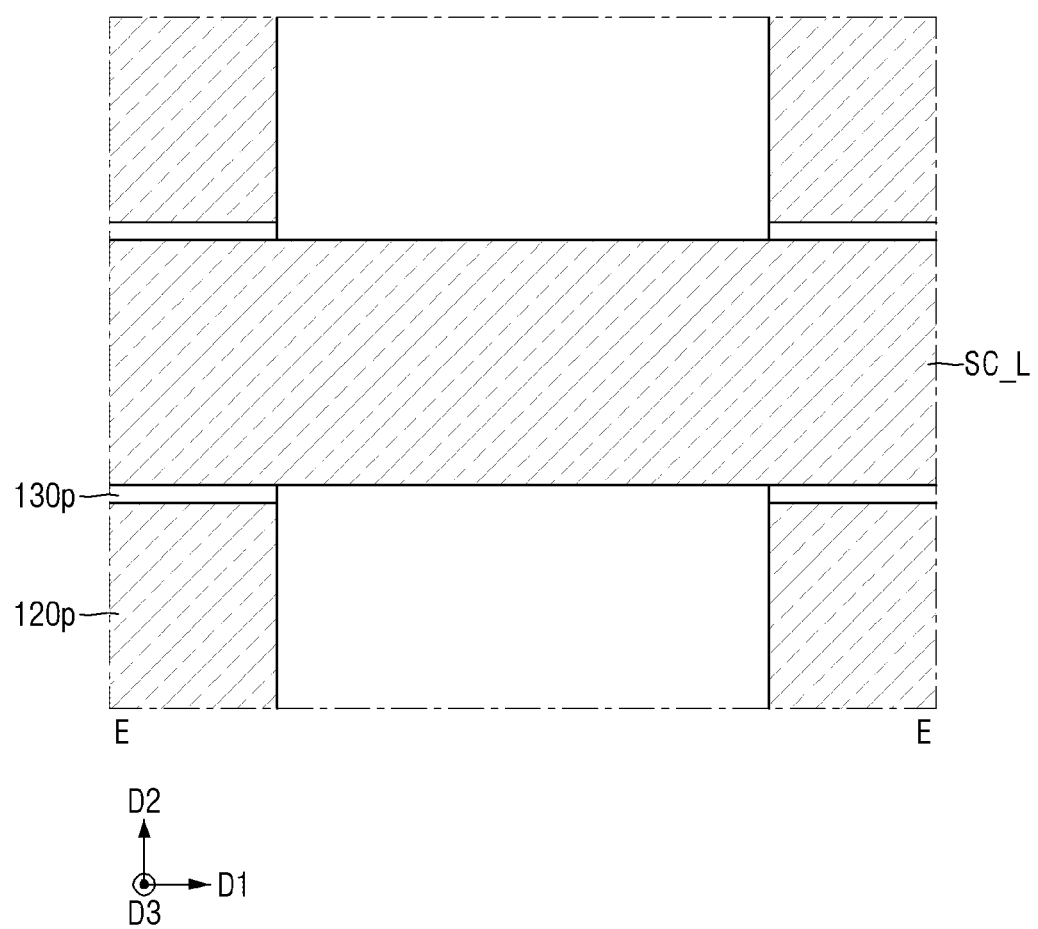

Referring to FIGS. 31 and 32, a first lower pattern BP1 and an upper pattern structure U_AP that extends long in the first direction D1 may be formed.

The upper pattern structure U_AP may be placed on the first lower pattern BP1. The upper pattern structure U_AP may include a sacrificial pattern SC_L and an active pattern ACT_L alternately stacked on the first lower pattern BP1.

For example, the sacrificial pattern SC_L may include a silicon-germanium film. The active pattern ACT_L may include a silicon film.

Subsequently, a dummy gate insulating film 130p, a dummy gate electrode 120p, and a dummy gate capping film 120_HM may be formed on the upper pattern structure U_AP. The dummy gate insulating film 130p may include, but is not limited to, for example, silicon oxide. The dummy gate electrode 120p may include, but is not limited to, for example, polysilicon. The dummy gate capping film 120_HM may include, but is not limited to, for example, silicon nitride.

Figure 33:
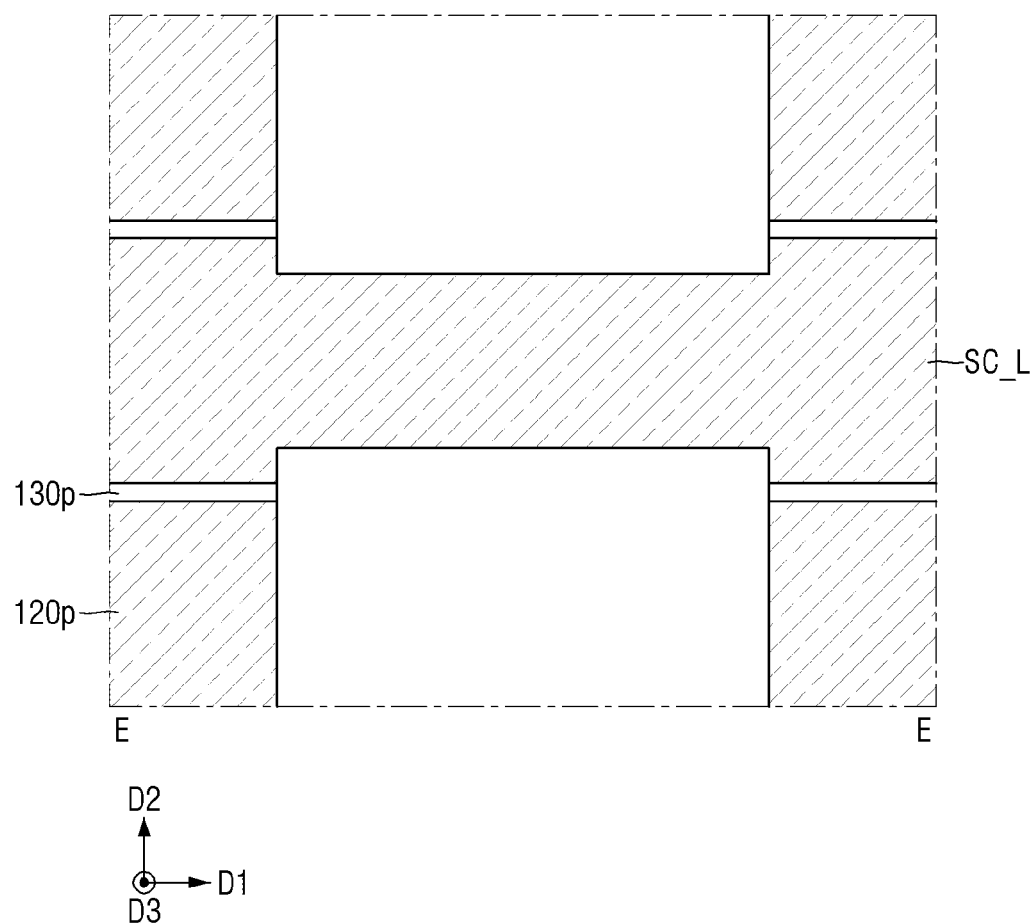

Referring to FIG. 33, some of the sacrificial pattern SC_L and the active pattern ACT_L which are not covered with the dummy gate electrode 120p may be etched. Through such an etching process, the width in the second direction D2 of the sacrificial pattern SC_L and the active pattern ACT_L which are not covered with the dummy gate electrode 120p may decrease.

As an example, while the width of the sacrificial pattern SC_L and the active pattern ACT_L in the second direction D2 decreases, a part of the uppermost active pattern ACT_L may not be etched. As another example, a part of the uppermost active pattern ACT_L may be etched, while the width of the sacrificial pattern SC_L and the active pattern ACT_L in the second direction D2 decreases.

The following description will be provided using a case where a part of the uppermost active pattern ACT_L is not etched.

Figure 34:
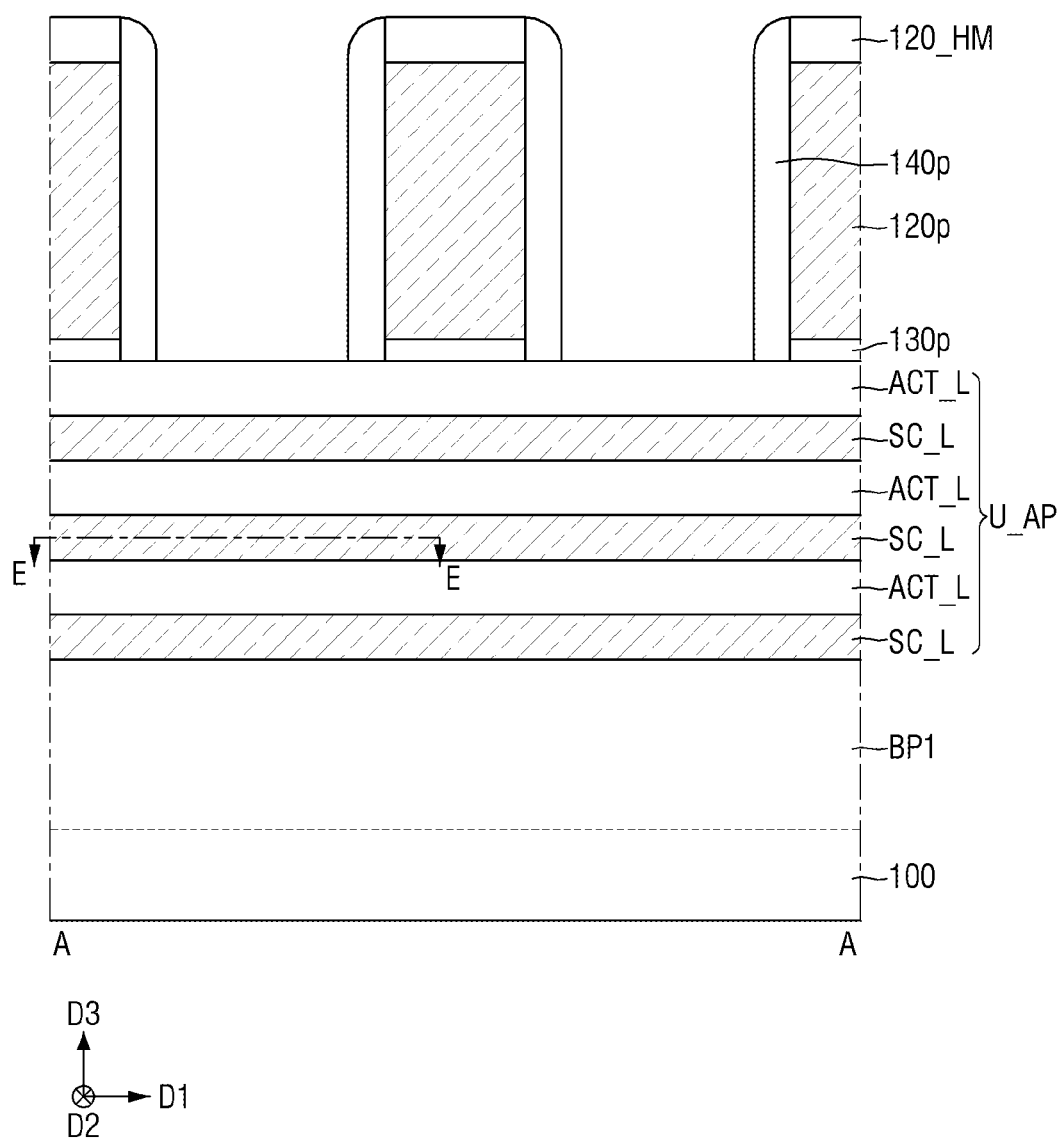
Figure 35:
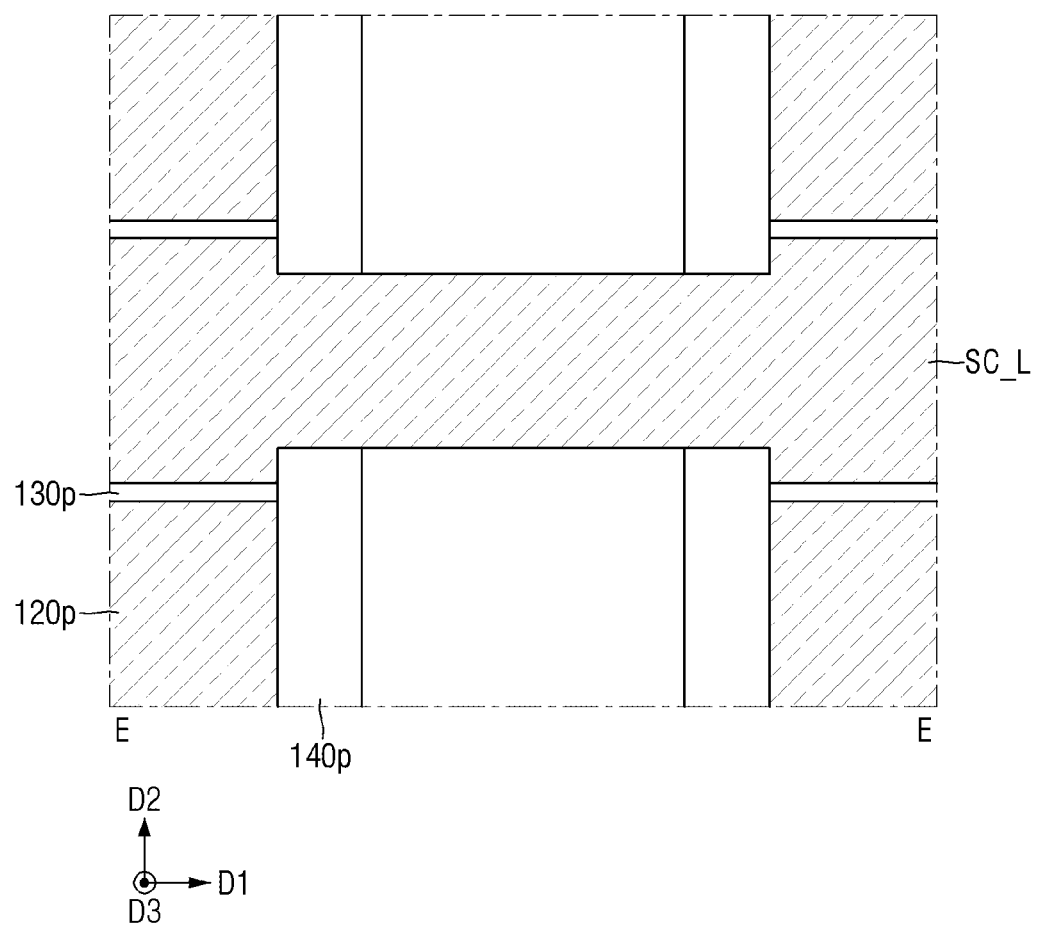

Referring to FIGS. 34 and 35, a pre gate spacer 140p may be formed on the side walls of the dummy gate electrode 120p.

The pre gate spacer 140p may extend long in the second direction D2.

Figure 36:
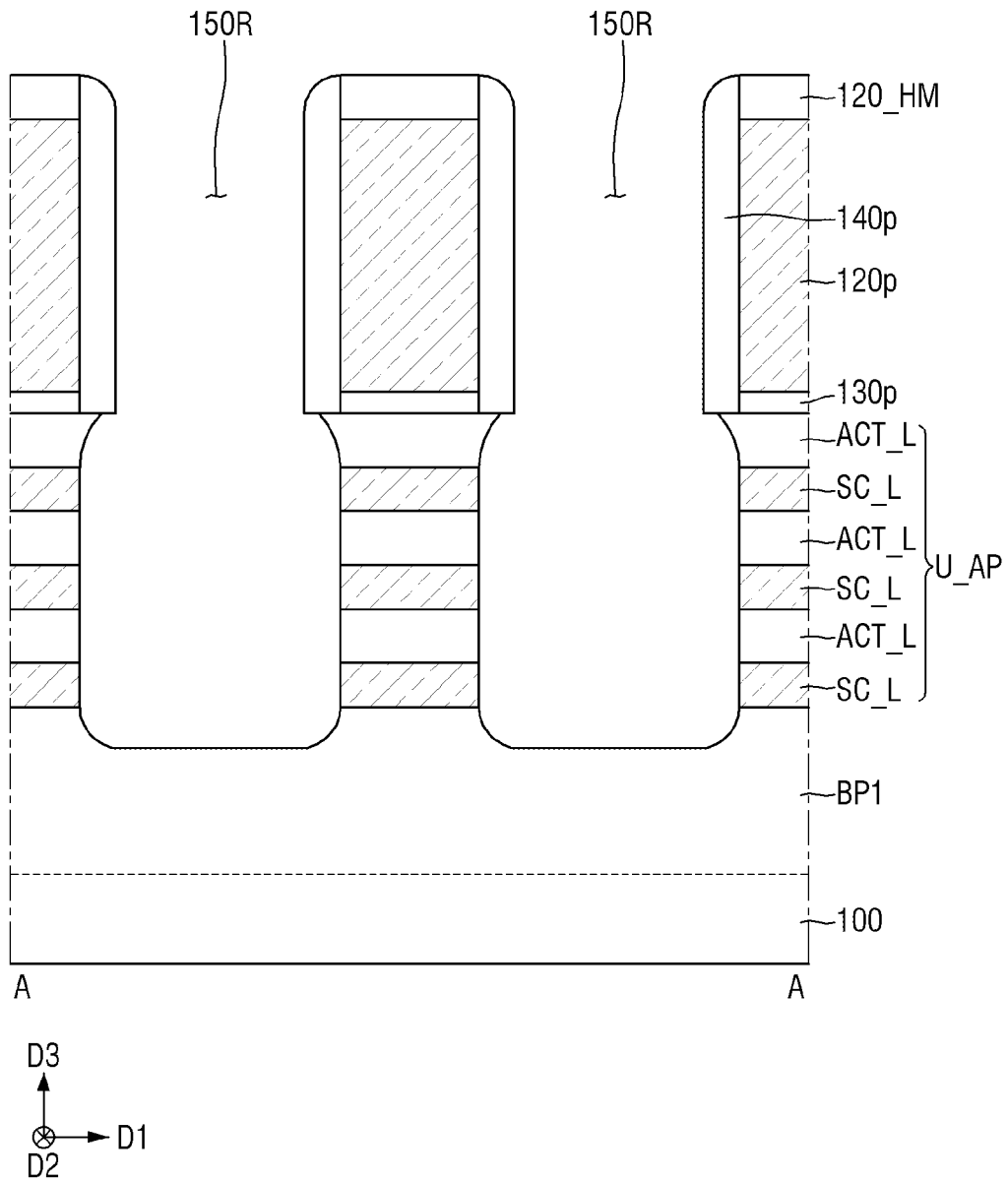

Referring to FIG. 36, the first source/drain recess 150R may be formed inside the upper pattern structure U_AP, using the dummy gate electrode 120p and the pre gate spacer 140p as masks. The first source/drain recess 150R may be undercut to the lower part of the pre gate spacer 140p.

A part of the first source/drain recess 150R may be formed inside the first lower pattern BP1.

Figure 37:
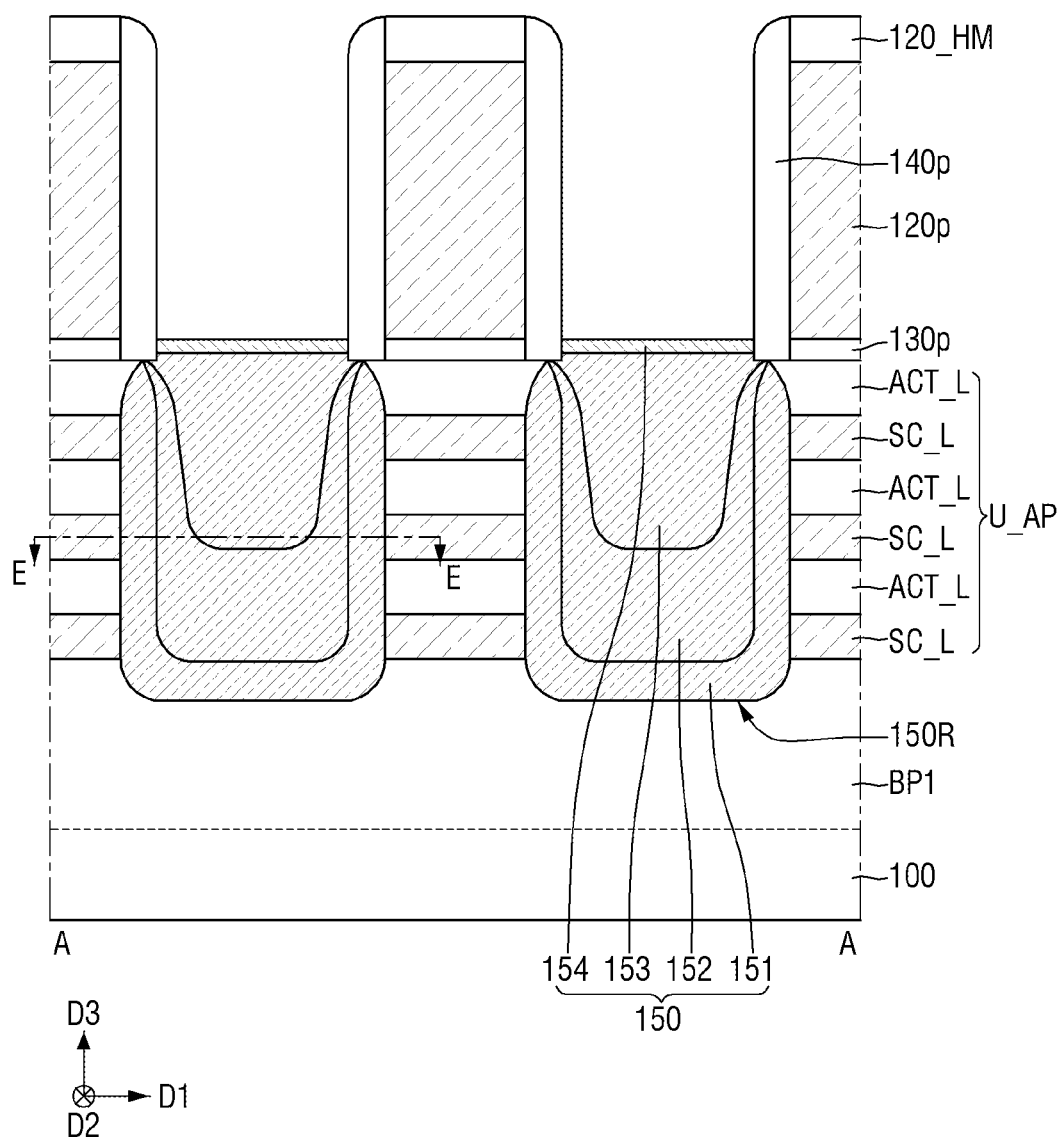
Figure 38:
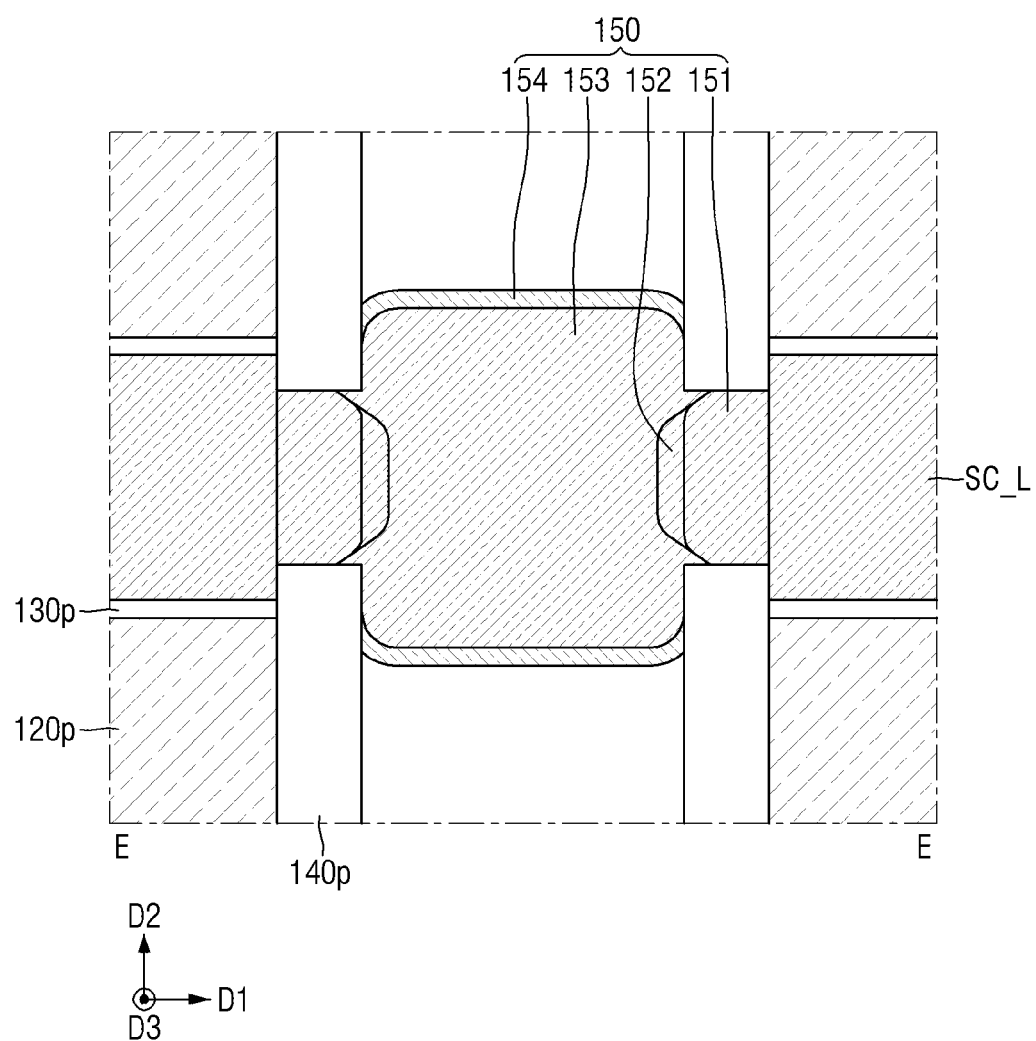

Referring to FIGS. 37 and 38, a first source/drain pattern 150 may be formed inside the first source/drain recess 150R.

The first source/drain pattern 150 may include a lower semiconductor pattern 151, an upper semiconductor pattern 152, a filling semiconductor pattern 153, and a capping semiconductor pattern 154.

Subsequently, referring to FIGS. 2 and 7, an etching stop film 185 and an interlayer insulating film 190 may be sequentially formed on the first source/drain pattern 150. Subsequently, a part of the interlayer insulating film 190, a part of the etching stop film 185, and the dummy gate capping film 120_HM may be removed to expose the upper surface of the dummy gate electrode 120p. The first gate spacer 140 may be formed, while the upper surface of the dummy gate electrode 120p is being exposed.

Subsequently, the dummy gate insulating film 130p and the dummy gate electrode 120p may be removed to expose the upper pattern structure U_AP between the first gate spacers 140. Subsequently, the sacrificial pattern SC_L may be removed to form the first sheet pattern NS1. A part of the first source/drain pattern 150 may be exposed, while the first sheet pattern NS1 is being formed.

Subsequently, the first gate insulating film 130 and the first gate electrode 120 may be formed. Moreover, the first gate capping pattern 145 may be formed.

Figure 39:
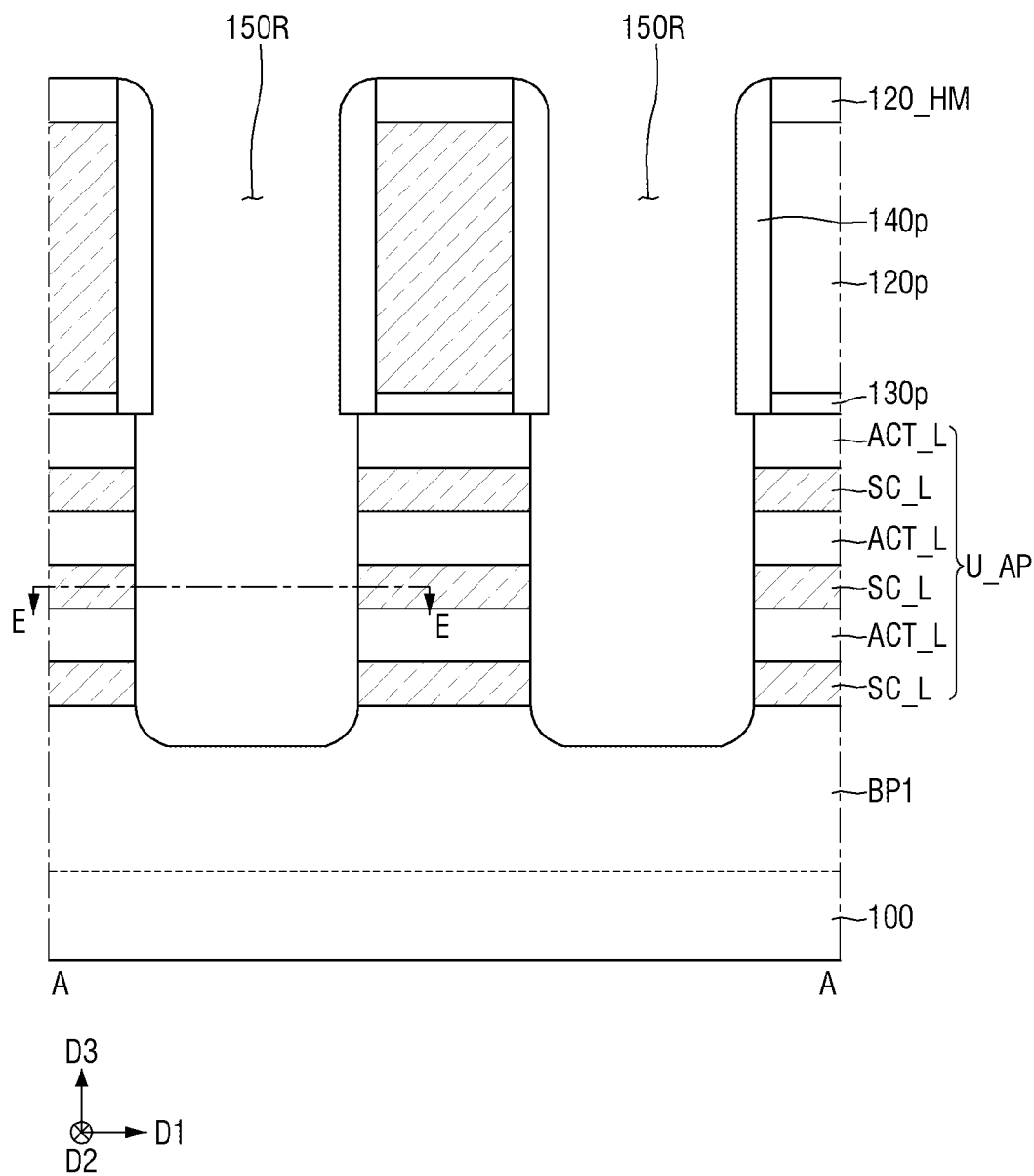
FIGS. 39 to 44 are intermediate stage diagrams for explaining a method for fabricating a semiconductor device according to some embodiments of the present disclosure.
Figure 40:
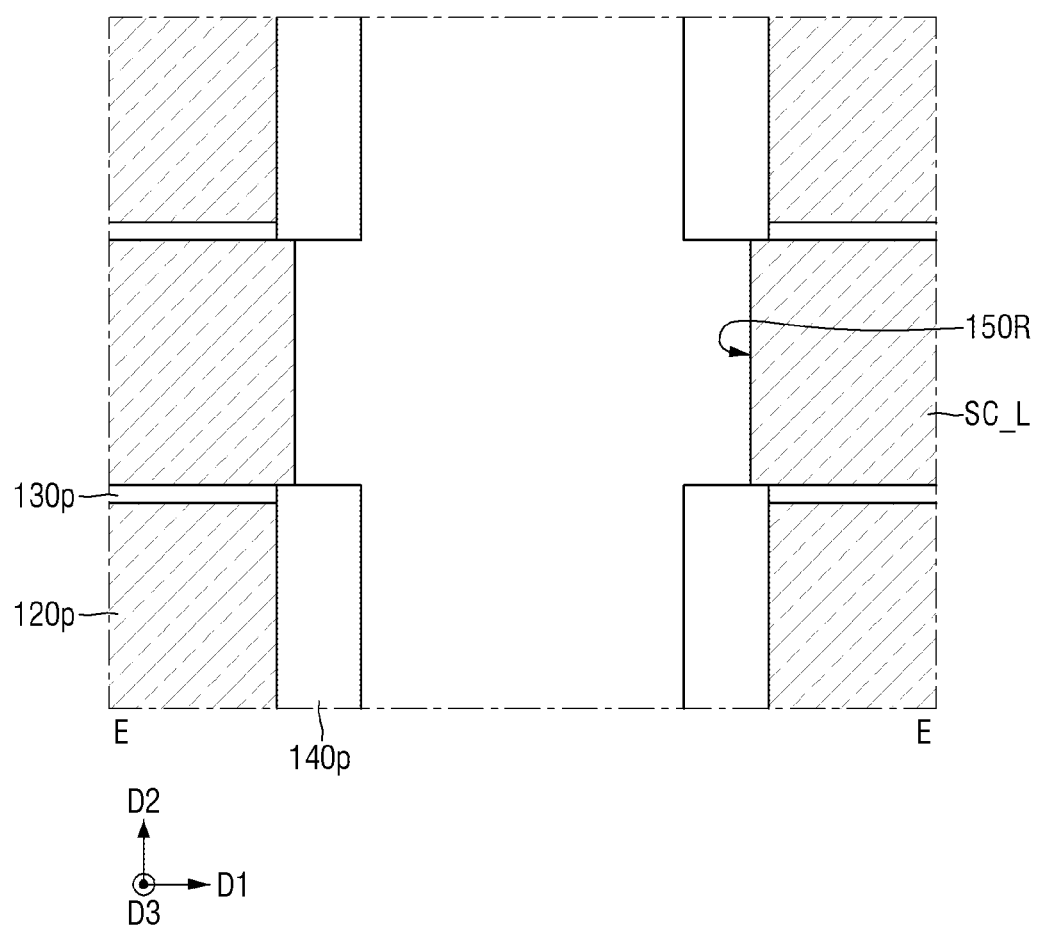
Figure 41:
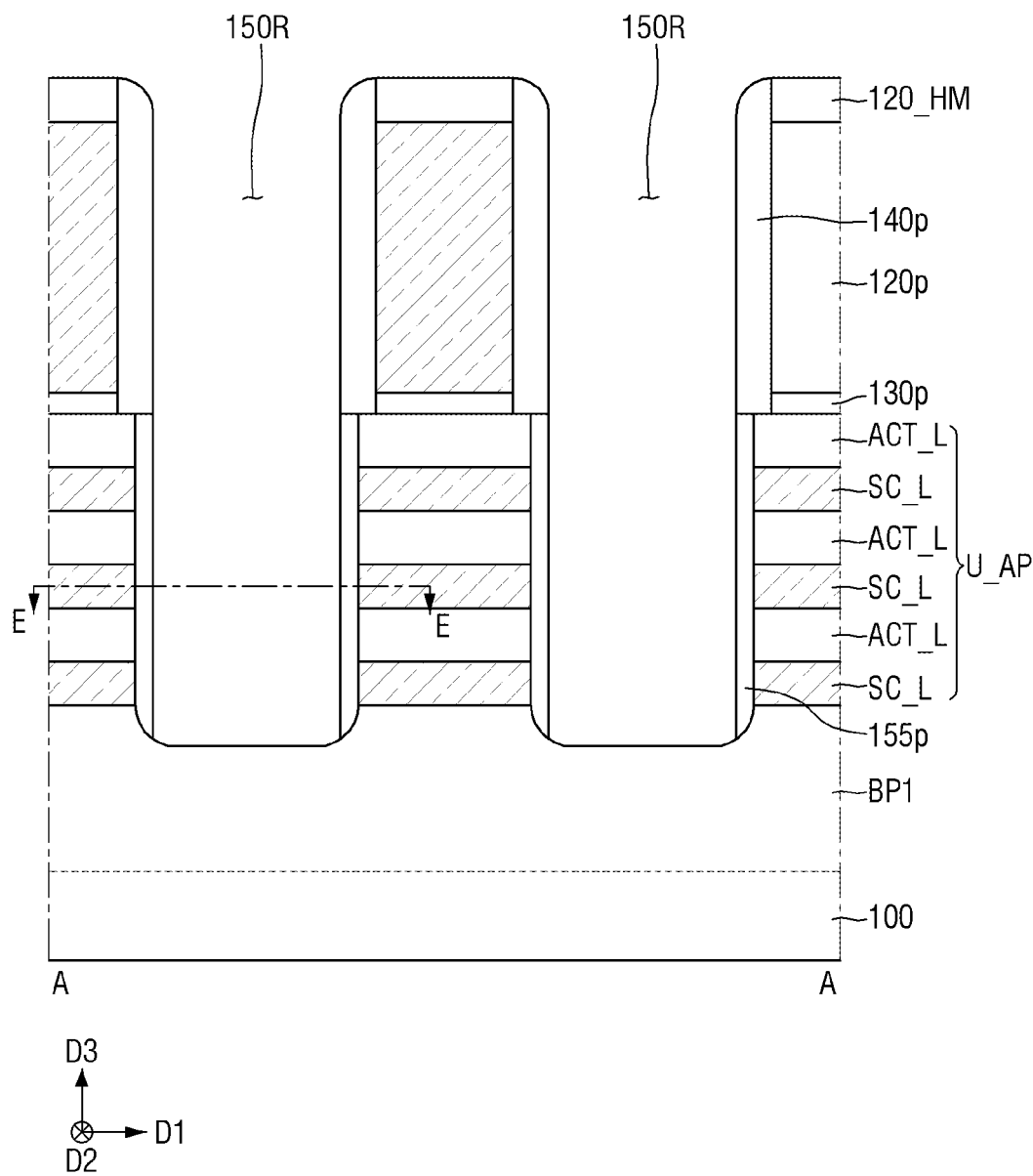
Figure 42:
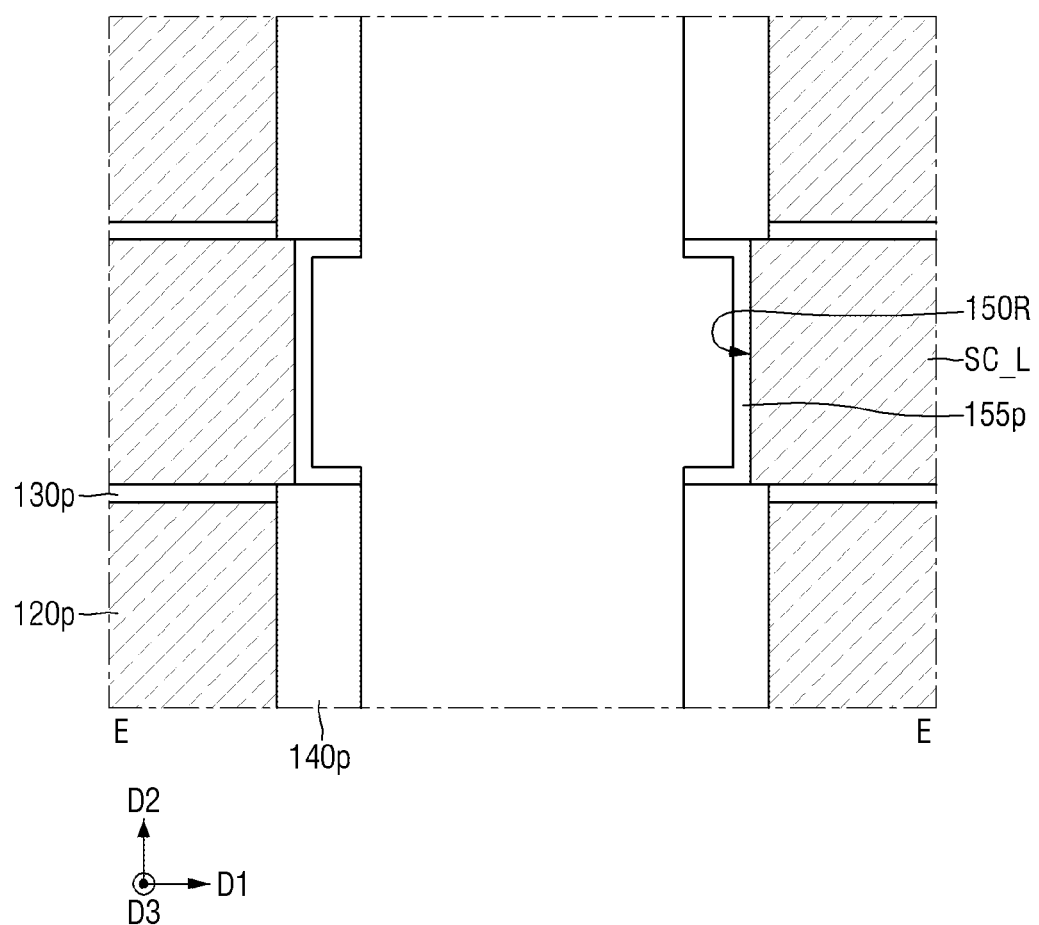
Figure 43:
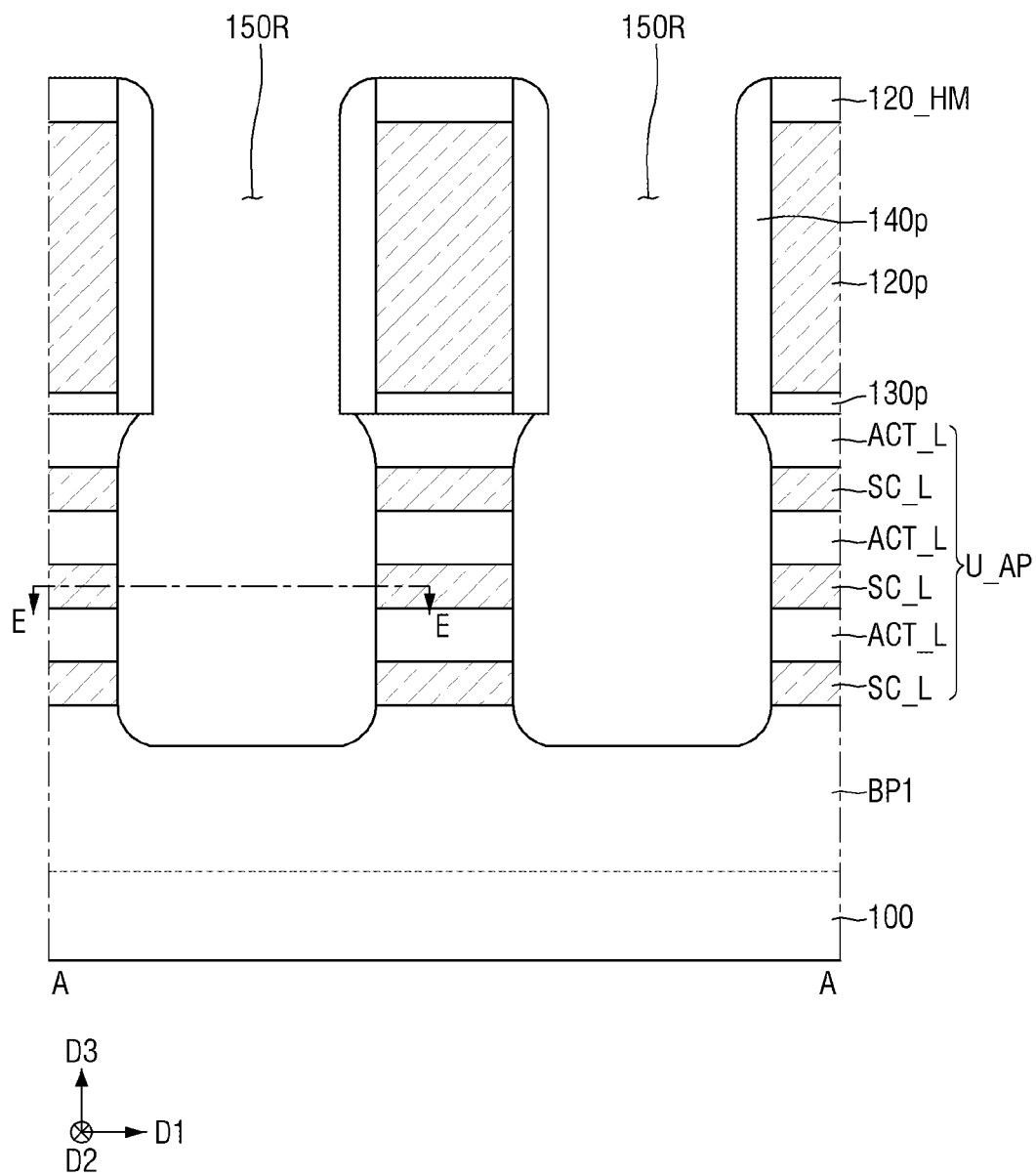
Figure 44:
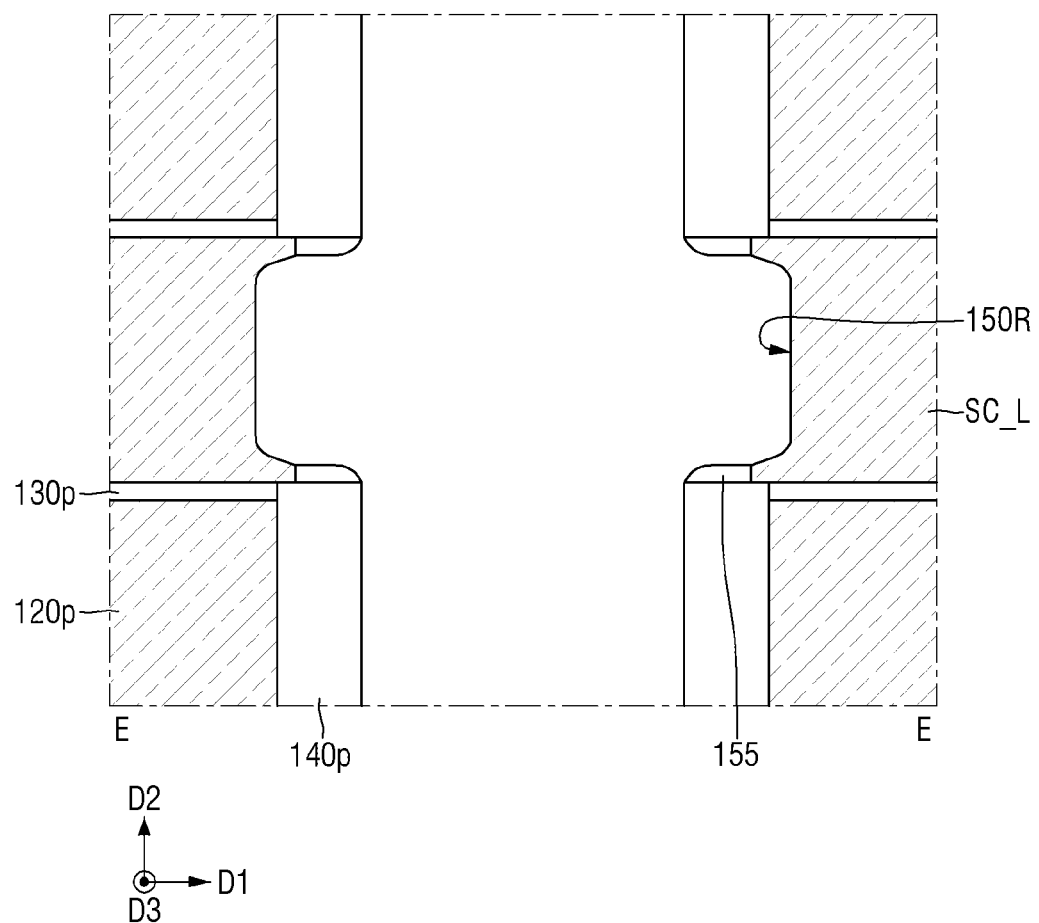

FIGS. 39 to 44 are intermediate stage diagrams for explaining a method for fabricating a semiconductor device according to some embodiments of the present disclosure. For reference, FIGS. 39, 41 and 43 may be cross-sectional views taken along A-A of FIG. 1. FIGS. 40, 42 and 44 may be cross-sectional views taken along E-E of FIGS. 39, 41 and 43. In the following description, repeated parts of contents explained using FIGS. 31 to 38 will be briefly explained.

Referring to FIGS. 39 and 40, a first lower pattern BP1 and an upper pattern structure U_AP may be formed.

Subsequently, a dummy gate insulating film 130p, a dummy gate electrode 120p, a dummy gate capping film 120_HM, and a pre gate spacer 140p may be formed on the upper pattern structure U_AP.

Subsequently, a first source/drain recess 150R may be formed inside the upper pattern structure U_AP, using the dummy gate electrode 120p and the pre gate spacer 140p as masks.

Referring to FIGS. 41 and 42, a pre epi-spacer 155p may be formed on the side wall of the first source/drain recess 150R defined by the upper pattern structure U_AP and the pre gate spacer 140p.

More specifically, a pre epi-spacer 155p may be formed along the profile of the first source/drain recess 150R. Subsequently, the pre epi-spacer 155p formed on the bottom surface of the first source/drain recess 150R may be removed, using anisotropic etching.

Referring to FIGS. 43 and 44, a part of the pre epi-spacer 155p formed on the side walls of the first source/drain recess 150R may be removed, using the isotropic etching.

Accordingly, an epi-spacer 155 protruding from the sacrificial pattern SC_L and the active pattern ACT_L may be formed.

During the formation of the epi-spacer 155, some of the sacrificial pattern SC_L and active pattern ACT_L may be removed, and the width of the first source/drain recess 150R in the first direction D1 may increase. Unlike the shown configuration, the width of the first source/drain recess 150R in the first direction D1 may not increase, during the formation of the epi-spacer 155.

Subsequently, the first source/drain pattern 150 may be formed inside the first source/drain recess 150R.

In concluding the detailed description, those skilled in the art will appreciate that many variations and modifications may be made to the embodiments described herein without substantially departing from the scope of the present disclosure. Therefore, the disclosed embodiments of the disclosure are used in a generic and descriptive sense only and not for purposes of limitation.

What is claimed is:

1. A semiconductor device comprising:
   an active pattern comprising a lower pattern and a sheet pattern, wherein the sheet pattern is spaced apart from the lower pattern in a first direction;
   a gate structure on the lower pattern, wherein the gate structure comprises a gate electrode that surrounds the sheet pattern, and wherein the gate electrode extends in a second direction that is perpendicular to the first direction; and
   a source/drain pattern on the lower pattern and in contact with the sheet pattern,
   wherein a contact surface between the sheet pattern and the source/drain pattern has a first width in the second direction,
   wherein the sheet pattern has a second width in the second direction that is greater than the first width,
   wherein the sheet pattern comprises an epi-trench at one end of the sheet pattern that penetrates the sheet pattern in a third direction perpendicular to the first direction and the second direction, and
   wherein a part of the source/drain pattern is within the epi-trench.

2. The semiconductor device of claim 1, wherein the gate structure comprises:
   a gate spacer on the gate electrode; and
   a gate insulating film between the gate electrode and the gate spacer, and
   wherein the gate spacer overlaps the sheet pattern in the third direction.

3. The semiconductor device of claim 2, wherein the gate structure comprises a spacer boundary extending in the second direction between the gate insulating film and the gate spacer, and
   wherein at least a portion of the sheet pattern is coplanar with the spacer boundary.

4. The semiconductor device of claim 2, further comprising an epi-spacer that protrudes from the sheet pattern in the third direction, the epi-spacer extending between the gate spacer and the source/drain pattern.

5. The semiconductor device of claim 1, further comprising:
   an epi-spacer that protrudes from the sheet pattern in the third direction, wherein the epi-spacer comprises side walls extending in the third direction, and
wherein the source/drain pattern is on the side walls of the epi-spacer.

6. The semiconductor device of claim 5, wherein the gate structure comprises:
a gate spacer on the gate electrode; and
a gate insulating film between the gate electrode and the gate spacer, and
wherein the gate spacer does not overlap the sheet pattern in the third direction.

7. The semiconductor device of claim 6, wherein the gate structure comprises a spacer boundary extending in the second direction between the gate insulating film and the gate spacer, and
wherein a part of the sheet pattern protrudes in the third direction from the spacer boundary.

8. The semiconductor device of claim 1, wherein the gate structure comprises a gate insulating film between the gate electrode and the source/drain pattern, and
wherein the gate insulating film is in contact with the source/drain pattern.

9. The semiconductor device of claim 1, wherein the source/drain pattern comprises a lower semiconductor pattern and an upper semiconductor pattern that is on the lower semiconductor pattern,
wherein the lower semiconductor pattern and the upper semiconductor pattern each comprise silicon-germanium, and
wherein a germanium fraction of the lower semiconductor pattern is lower than a germanium fraction of the upper semiconductor pattern.

10. A semiconductor device comprising:
an active pattern comprising a lower pattern and a plurality of sheet patterns spaced apart from the lower pattern in a first direction;
a gate structure comprising a gate insulating film that is on the lower pattern, a gate electrode on the gate insulating film, and a gate spacer on a side wall of the gate electrode, wherein the gate insulating film surrounds respective ones of the plurality of sheet patterns, and wherein the gate electrode extends in a second direction that is perpendicular to the first direction; and
a source/drain pattern on the lower pattern and in contact with each of the plurality of sheet patterns and the gate insulating film,
wherein the gate spacer overlaps each of the plurality of sheet patterns in a third direction that is perpendicular to the first direction and the second direction,
wherein a contact surface between the respective ones of the plurality of sheet patterns and the source/drain pattern has a first width in the second direction,
wherein the respective ones of the plurality of sheet patterns have a second width in the second direction that is greater than the first width,
wherein the source/drain pattern comprises a lower semiconductor pattern and an upper semiconductor pattern on the lower semiconductor pattern,
wherein the lower semiconductor pattern is in contact with the respective ones of the plurality of sheet patterns,
wherein the upper semiconductor pattern is in contact with the lower semiconductor pattern,
wherein the lower semiconductor pattern and the upper semiconductor pattern each comprise silicon-germanium,
wherein a germanium fraction of the lower semiconductor pattern is lower than a germanium fraction of the upper semiconductor pattern, and
wherein the upper semiconductor pattern is not in contact with the gate insulating film.

11. The semiconductor device of claim 10, wherein each of the plurality of sheet patterns further comprises an epi-trench at one end of the sheet pattern that penetrates the sheet pattern in the third direction, and
wherein a part of the source/drain pattern is within the epi-trench.

12. The semiconductor device of claim 10, wherein the gate structure comprises a spacer boundary extending in the second direction between the gate insulating film and the gate spacer, and
wherein at least a part of the sheet pattern is coplanar with the spacer boundary.

13. The semiconductor device of claim 10, wherein the plurality of sheet patterns comprise an uppermost sheet pattern,
wherein the gate spacer comprises a spacer hole extending in the first direction,
wherein the source/drain pattern is in contact with each of the sheet patterns through the spacer hole, and
wherein a height from an upper surface of the lower pattern to an uppermost part of the spacer hole is smaller than a height from the upper surface of the lower pattern to the upper surface of the uppermost sheet pattern.

14. A semiconductor device comprising:
an active pattern comprising a lower pattern and a plurality of sheet patterns spaced apart from the lower pattern in a first direction;
a gate structure comprising a gate insulating film on the lower pattern, a gate electrode on the gate insulating film, and a gate spacer on a side wall of the gate electrode, wherein the gate insulating film surrounds respective ones of the plurality of sheet patterns, and wherein the gate electrode extends in a second direction that is perpendicular to the first direction;
a source/drain pattern on the lower pattern and in contact with each of the sheet patterns and the gate insulating film; and
an epi-spacer between the gate spacer and the source/drain pattern in the second direction and extending in the first direction,
wherein the epi-spacer protrudes from each of the sheet patterns in a third direction that is perpendicular to the first direction and the second direction, and
wherein the epi-spacer is in contact with each of the sheet patterns and the gate insulating film.

15. The semiconductor device of claim 14, wherein a contact surface between each of the sheet patterns and the source/drain pattern has a first width in the second direction, and
wherein the respective ones of the sheet patterns have a second width in the second direction that is greater than the first width.

16. The semiconductor device of claim 14, wherein each of the sheet patterns further comprises an epi-trench at one end of the sheet pattern that penetrates the sheet pattern in the third direction, and
wherein a part of the source/drain pattern is within the epi-trench.

17. The semiconductor device of claim 14, wherein the gate structure comprises a spacer boundary extending in the second direction between the gate insulating film and the gate spacer, and wherein a part of the sheet pattern protrudes in the third direction from the spacer boundary.

\* \* \* \* \*